(12) United States Patent
Huang et al.

(10) Patent No.: US 12,015,071 B2
(45) Date of Patent: *Jun. 18, 2024

(54) AIR SPACERS AROUND CONTACT PLUGS AND METHOD FORMING SAME

(71) Applicant: Taiwan Semiconductor Manufacturing Co., Ltd., Hsinchu (TW)

(72) Inventors: Chen-Huang Huang, Hsinchu (TW); Ming-Jhe Sie, Taipei (TW); Yih-Ann Lin, Jhudong Township (TW); An Chyi Wei, Hsinchu (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/805,552

(22) Filed: Jun. 6, 2022

(65) Prior Publication Data

US 2022/0310820 A1    Sep. 29, 2022

Related U.S. Application Data

(63) Continuation of application No. 16/806,280, filed on Mar. 2, 2020, now Pat. No. 11,355,616.

(Continued)

(51) Int. Cl.
*H01L 29/49* (2006.01)
*H01L 21/285* (2006.01)
(Continued)

(52) U.S. Cl.
CPC .... *H01L 29/4991* (2013.01); *H01L 21/28518* (2013.01); *H01L 21/764* (2013.01);
(Continued)

(58) Field of Classification Search
CPC ........... H01L 29/4991; H01L 21/28518; H01L 21/764; H01L 29/45; H01L 29/66795;
(Continued)

(56) References Cited

U.S. PATENT DOCUMENTS 9,515,022 B2   12/2016   Kwon et al.
9,716,158 B1   7/2017    Cheng et al.
(Continued)

FOREIGN PATENT DOCUMENTS

CN    110098175 B    8/2021
KR    20160074306 A  6/2016
(Continued)

*Primary Examiner* — Herve-Louis Y Assouman
(74) *Attorney, Agent, or Firm* — Slater Matsil, LLP

(57) ABSTRACT

A method includes forming an opening in a first dielectric layer. A region underlying the first dielectric layer is exposed to the opening. The method further includes depositing a dummy silicon layer extending into the opening, and depositing an isolation layer. The isolation layer and the dummy layer include a dummy silicon ring and an isolation ring, respectively, in the opening. The opening is filled with a metallic region, and the metal region is encircled by the isolation ring. The dummy silicon layer is etched to form an air spacer. A second dielectric layer is formed to seal the air spacer.

20 Claims, 32 Drawing Sheets

Related U.S. Application Data

(60) Provisional application No. 62/928,746, filed on Oct. 31, 2019.

(51) Int. Cl.
*H01L 21/3213* (2006.01)
*H01L 21/764* (2006.01)
*H01L 21/768* (2006.01)
*H01L 21/8234* (2006.01)
*H01L 29/45* (2006.01)
*H01L 29/66* (2006.01)
*H01L 29/78* (2006.01)

(52) U.S. Cl.
CPC ........ *H01L 29/45* (2013.01); *H01L 29/66795* (2013.01); *H01L 29/7851* (2013.01)

(58) Field of Classification Search
CPC ........... H01L 29/7851; H01L 21/32137; H01L 21/7682; H01L 21/76897; H01L 21/76834; H01L 21/76831; H01L 2221/1063; H01L 21/823431; H01L 21/823475; H01L 2221/1047
See application file for complete search history.

(56) References Cited

U.S. PATENT DOCUMENTS

| | | | |
|---|---|---|---|
| 10,236,255 | B2 | 3/2019 | Li et al. |
| 10,573,552 | B2 | 2/2020 | Wiseman et al. |
| 10,923,389 | B2 | 2/2021 | Park et al. |
| 11,355,616 | B2 * | 6/2022 | Huang .............. H01L 21/28518 |
| 2002/0047151 | A1 | 4/2002 | Kim et al. |
| 2012/0168895 | A1 | 7/2012 | Yin et al. |
| 2013/0298942 | A1 | 11/2013 | Ren et al. |
| 2014/0004708 | A1 | 1/2014 | Thedjoisworo et al. |
| 2014/0131806 | A1 | 5/2014 | Zhu et al. |
| 2015/0243544 | A1 | 8/2015 | Alptekin et al. |
| 2016/0365426 | A1 * | 12/2016 | Ching ................... H01L 29/785 |

FOREIGN PATENT DOCUMENTS

| | | |
|---|---|---|
| KR | 20190109187 A | 9/2019 |
| TW | 201403707 A | 1/2014 |
| TW | 201834145 A | 9/2018 |

\* cited by examiner

AIR SPACERS AROUND CONTACT PLUGS AND METHOD FORMING SAME

PRIORITY CLAIM AND CROSS-REFERENCE

This application is a continuation of U.S. patent application Ser. No. 16/806,280, entitled "Air Spacers Around Contact Plugs and Method Forming Same," filed Mar. 2, 2020, which claims the benefit of the Provisional Application No. 62/928,746, entitled "Air spacers around contact plugs and Method Forming Same," and filed Oct. 31, 2019, which applications are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per unit chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers are using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
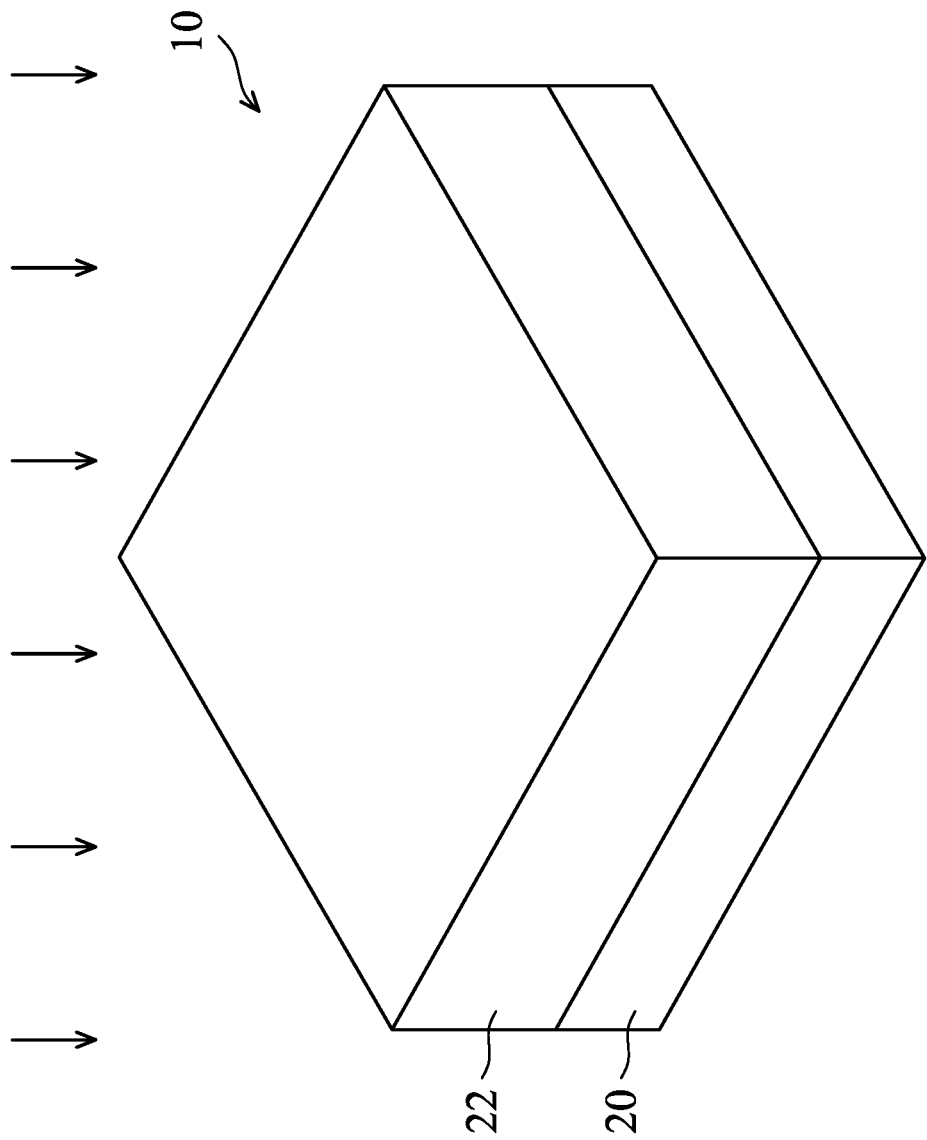
FIGS. 1-8, 9A, 9B, 10A, 10B, 11-13, 14A, 14B, 15-17, 18A, 18B, 18C, 18D, 19A, 19B, and 20 illustrate the perspective views, cross-sectional views, and top views of intermediate stages in the formation of Fin Field-Effect Transistors (FinFETs), contact plugs, and air spacers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An air spacer surrounding a contact plug and the method of forming the same are provided in accordance with some embodiments. The intermediate stages in the formation of the air spacer are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, an air spacer is formed to encircle a contact plug. The air spacer has the effect of reducing parasitic capacitance between the contact plug and adjacent conductive features. The formation of the air spacer includes depositing a sacrificial layer such as a silicon layer into a contact opening, depositing an isolation layer on the silicon layer, performing an anisotropic etching on the silicon layer and the isolation layer, depositing a capping layer, performing an annealing process to form a silicide region, and filling the contact opening with a metallic material. A planarization process is then performed, followed by the removal of the silicon layer to form the air spacer. In the etching of the silicon layer, a ratio of the flow rate of hydrogen ($H_2$) to the flow rate of $NF_3$ is adjusted to prevent the formation of adverse byproduct that may pre-mature seal the path for removing the silicon layer. Although FinFET is used as an example, the contact plug and the air spacer may also be formed for other types of transistors such as planar transistors, Gate-All-Around (GAA) transistors, or the like. Also, the air spacers, in addition to be formed around contact plugs, may also be used to surround other types of conductive features such as conductive lines, conductive vias, etc. in order to reduce parasitic capacitance.

FIGS. 1-8, 9A, 9B, 10A, 10B, 11-13, 14A, 14B, 15-17, 18A, 18B, 18C, 18D, 19A, 19B, and 20 illustrate the perspective views, cross-sectional views, and plane views of intermediate stages in the formation of a FinFET, and an air spacer surrounding a contact plug in accordance with some embodiments of the present disclosure. The corresponding processes are also reflected schematically in the process flow shown in FIG. 25.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In accordance with some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 25:
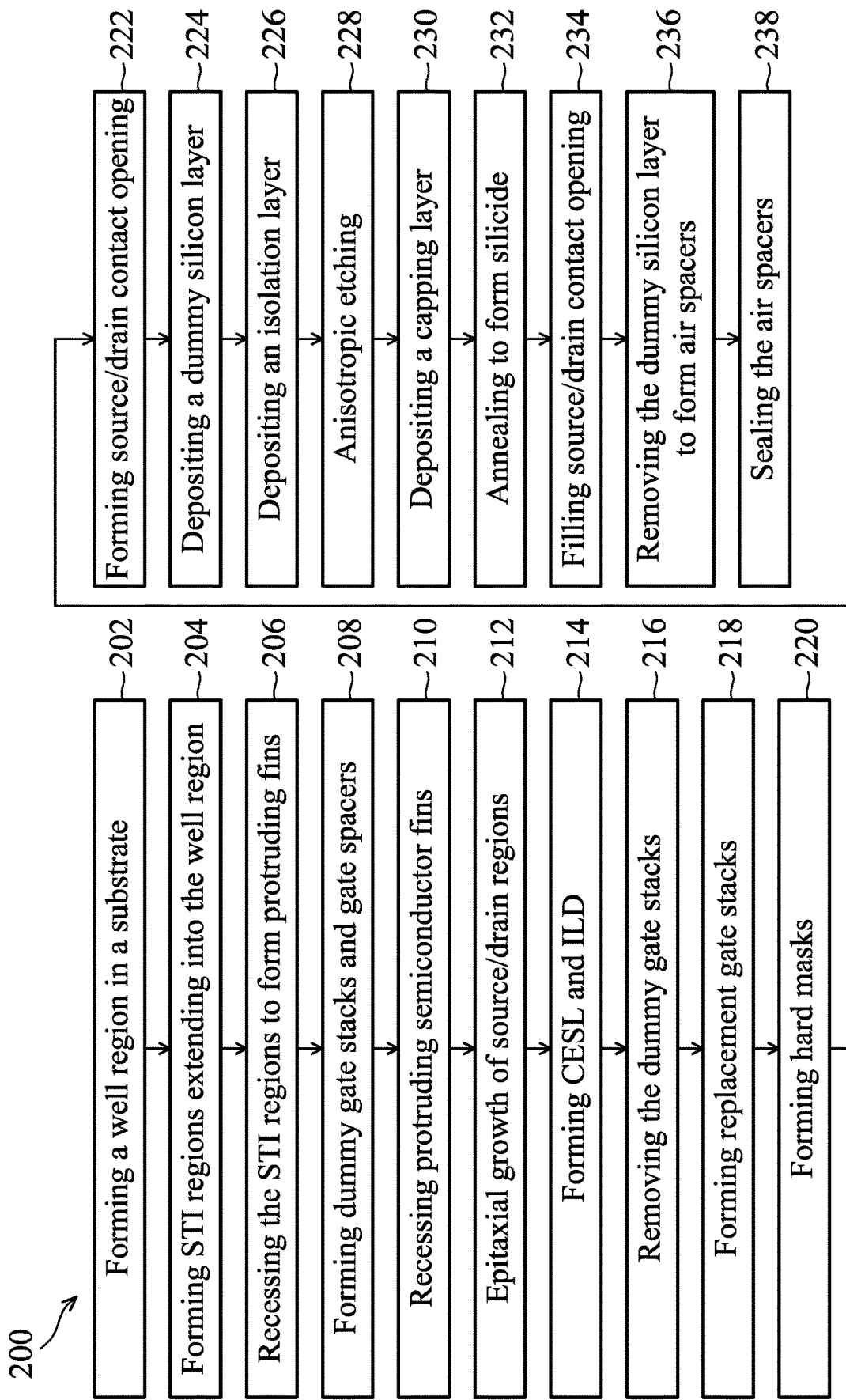
FIG. 25 illustrates a process flow for forming a FinFET, the corresponding contact plugs, and air spacers in accordance with some embodiments.

Further referring to FIG. 1, well region 22 is formed in substrate 20. The respective process is illustrated as process 202 in the process flow 200 as shown in FIG. 25. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
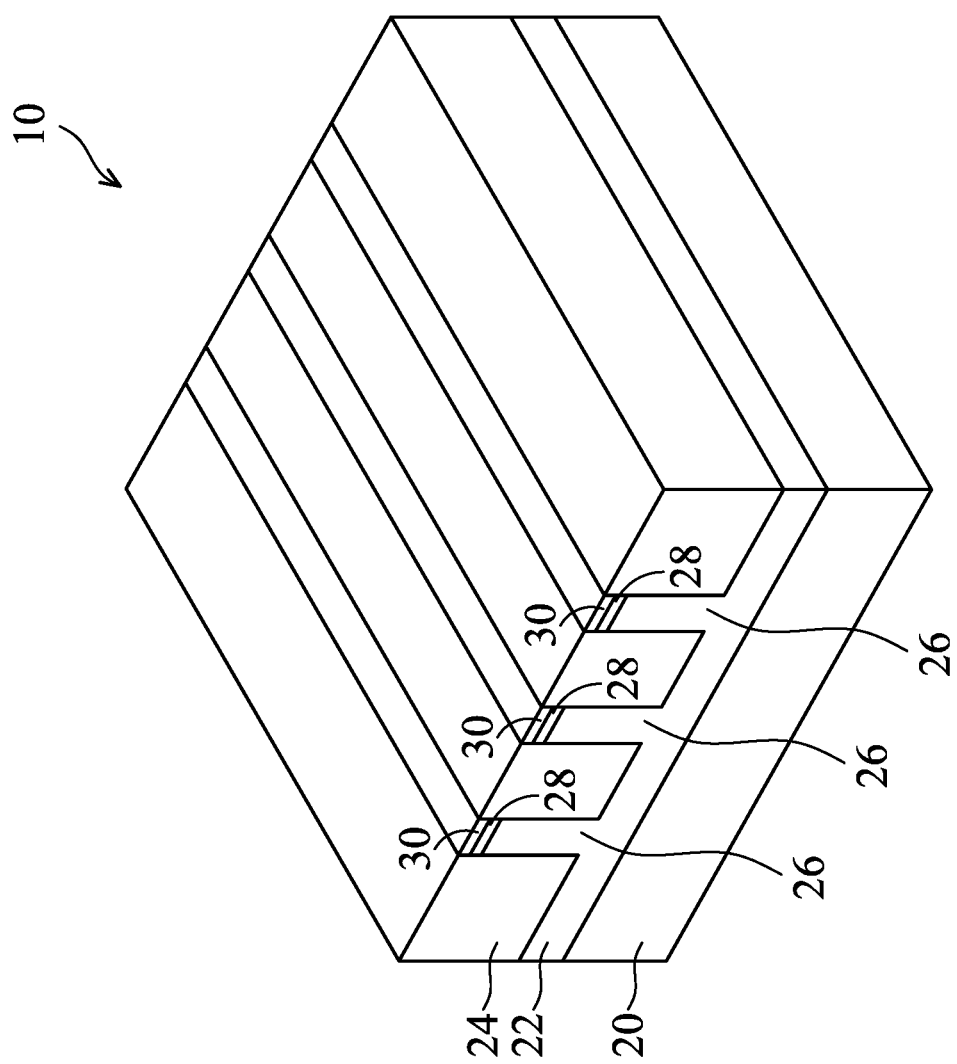

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 25. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
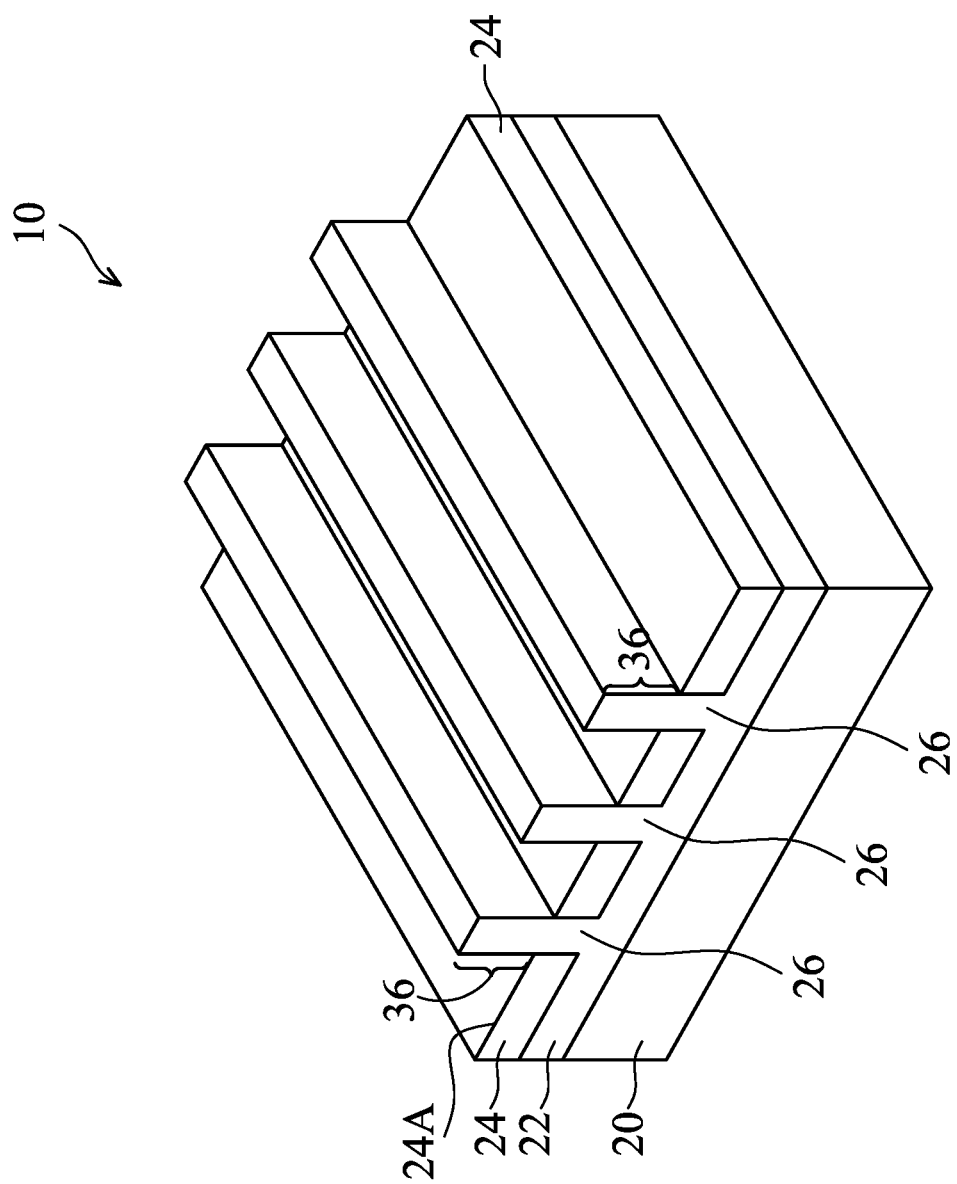

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 as shown in FIG. 25. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
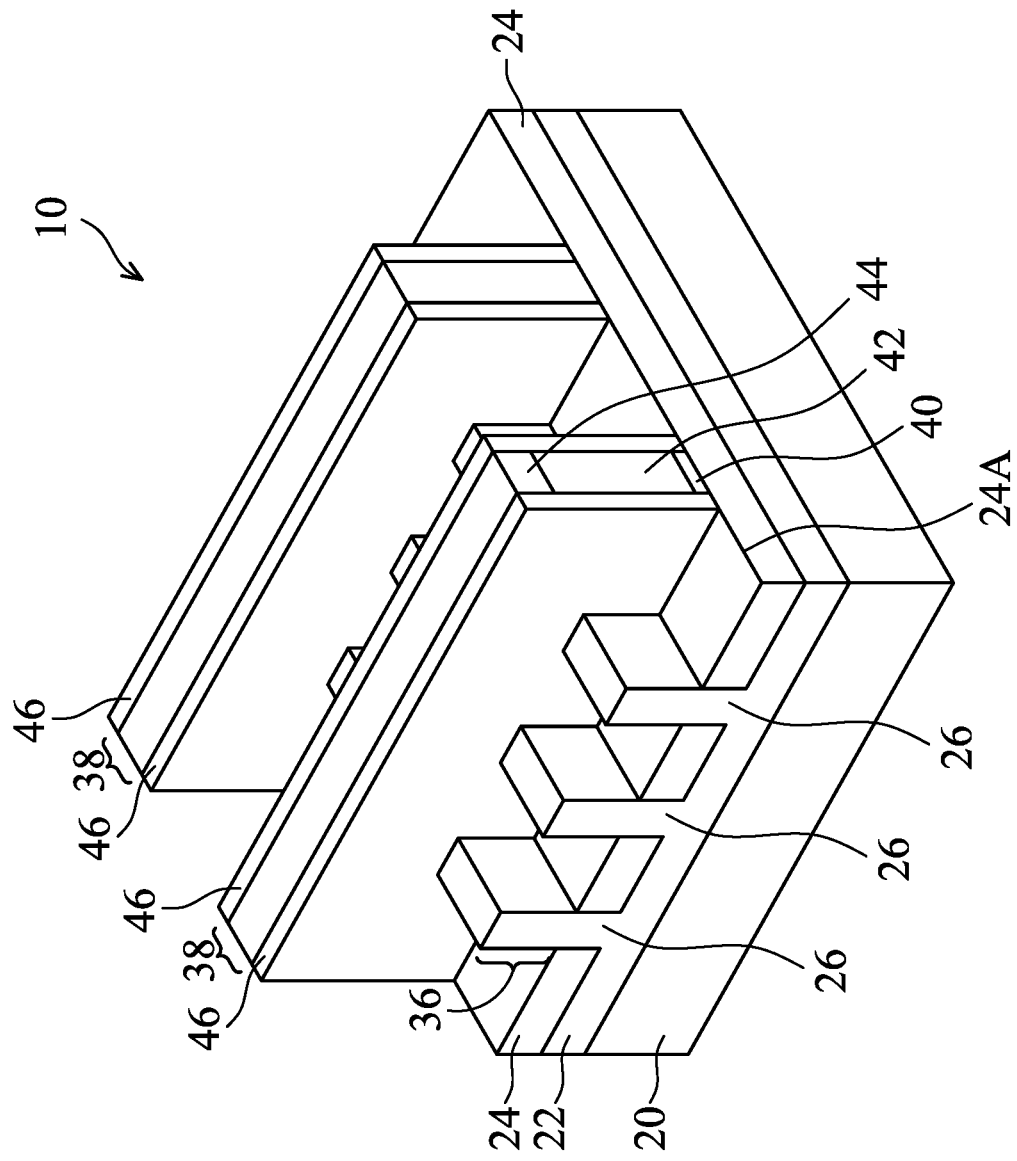

Referring to FIG. 4, dummy gate stacks 38 are formed to extend on the top surfaces and the sidewalls of (protruding) fins 36. The respective process is illustrated as process 208 in the process flow 200 as shown in FIG. 25. Dummy gate stacks 38 may include dummy gate dielectrics 40 and dummy gate electrodes 42 over dummy gate dielectrics 40.

Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 as shown in FIG. 25. In accordance with some embodiments of the present disclosure, gate spacers 46 are formed of a dielectric material(s) such as silicon oxy-carbo-nitride (SiOCN), silicon nitride, silicon carbo-nitride, or the like, and may have a single-layer structure or a multi-layer structure including a plurality of dielectric layers.

Figure 5:
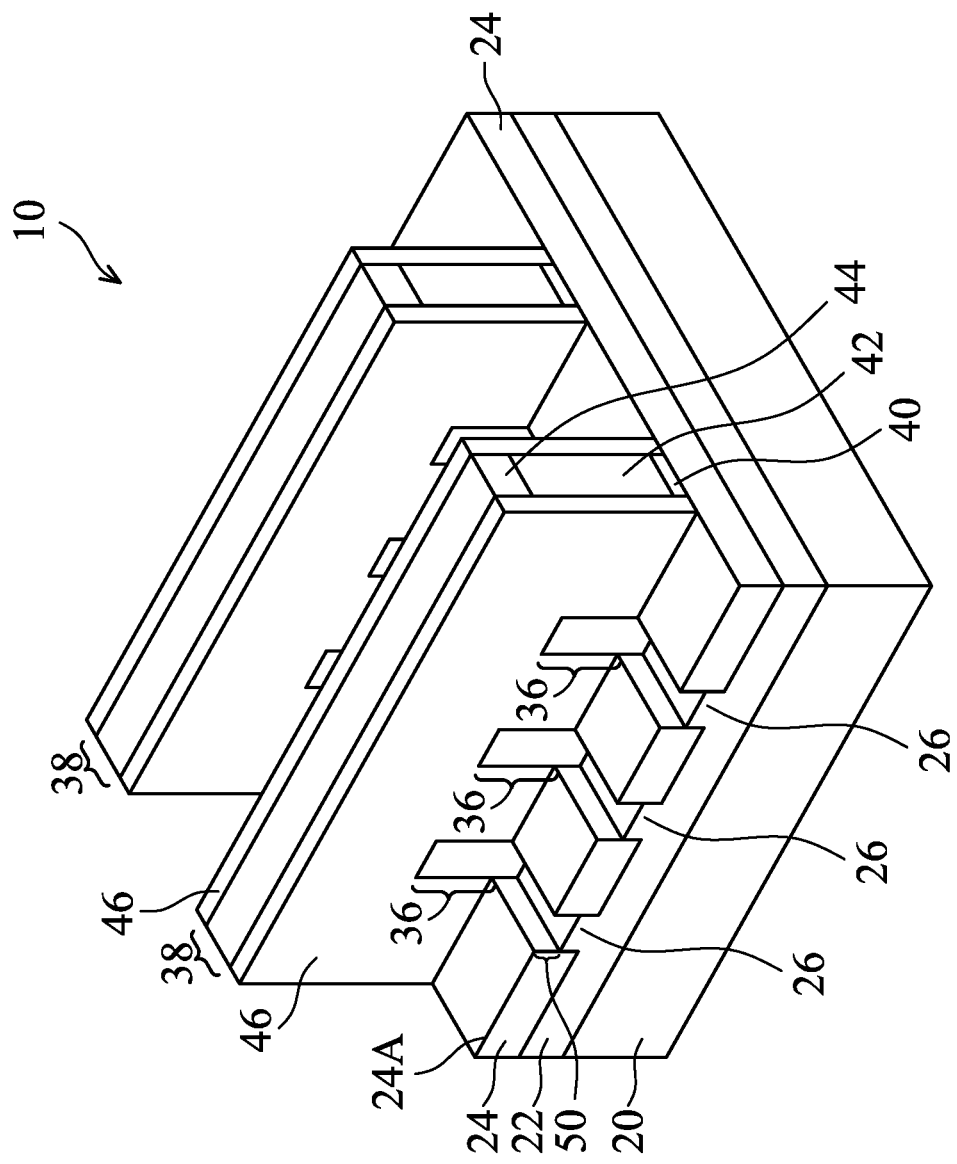

An etching process is then performed to etch the portions of protruding fins 36 that are not covered by dummy gate stacks 38 and gate spacers 46, resulting in the structure shown in FIG. 5. The respective process is illustrated as process 210 in the process flow 200 as shown in FIG. 25. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. The spaces left by the etched protruding fins 36 are referred to as recesses 50. Recesses 50 comprise portions located between neighboring gate stack 38. Some lower portions of recesses 50 are between neighboring STI regions 24.

Figure 6:
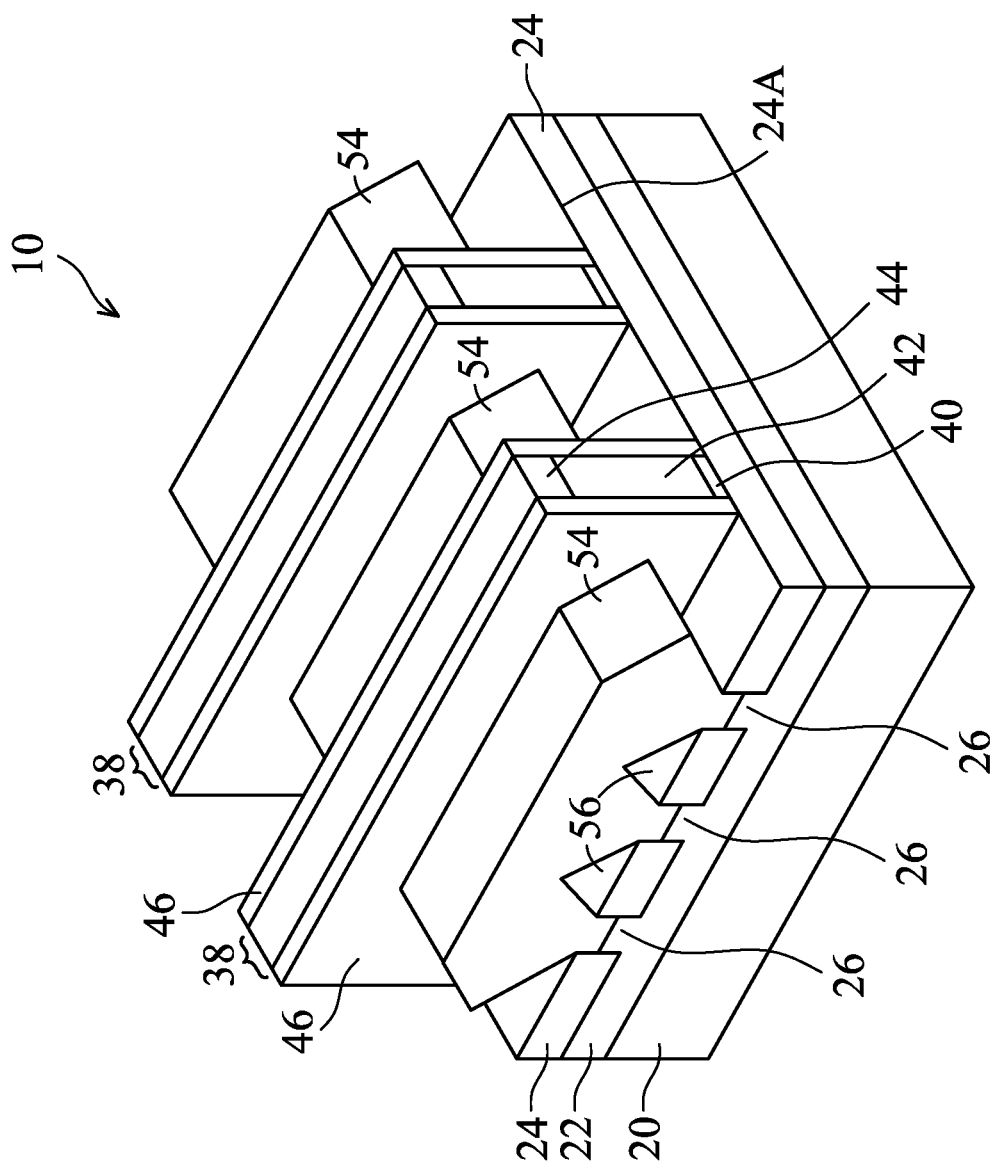

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 as shown in FIG. 25. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy process, epitaxy regions 54 may be further implanted with a p-type or an n-type impurity to form source and drain regions, which are also denoted using reference numeral 54. In accordance with alternative embodiments of the present disclosure, the implantation process is skipped when epitaxy regions 54 are in-situ doped with the p-type or n-type impurity during the epitaxy.

Figure 7:
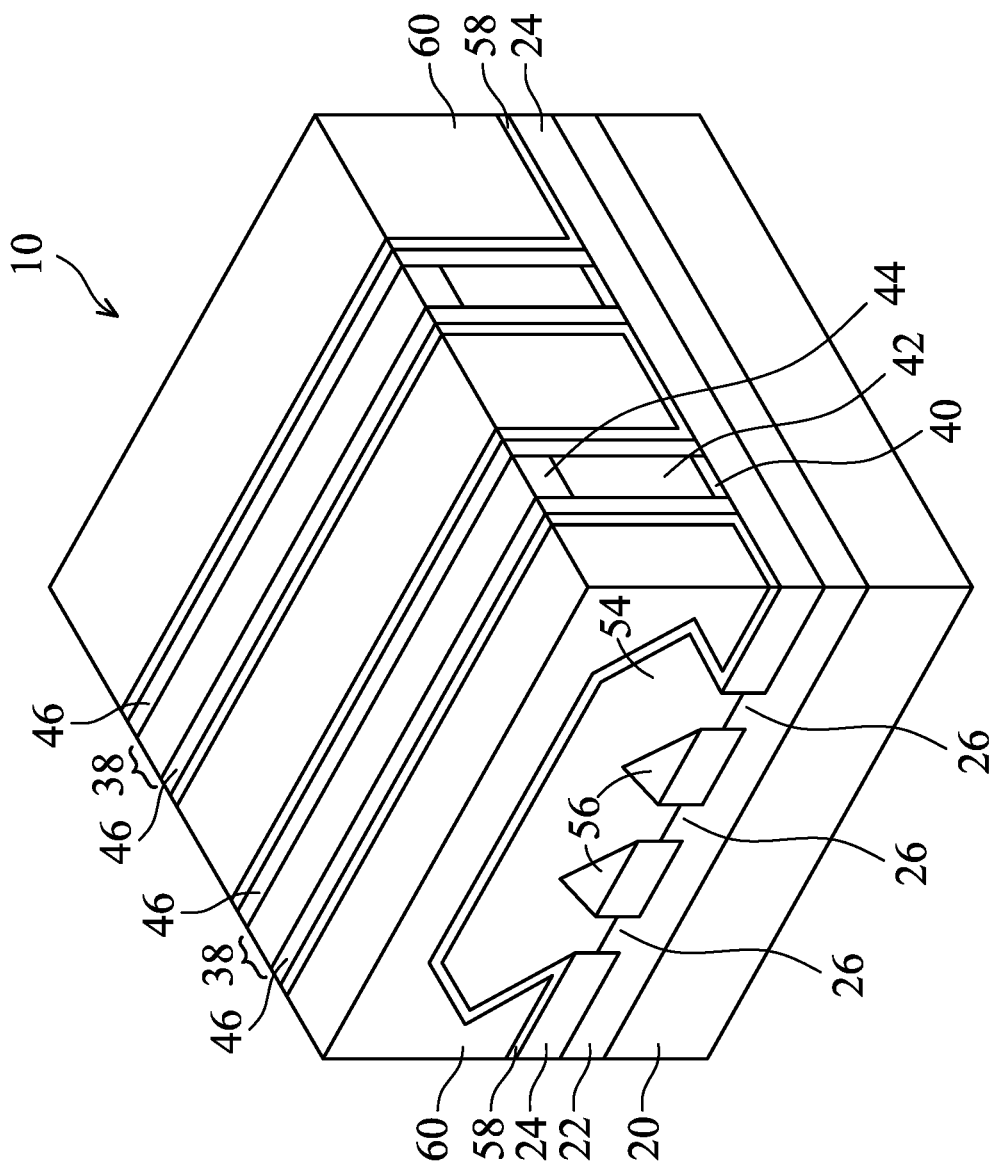

FIG. 7 illustrates a perspective view of the structure after the formation of Contact Etch Stop Layer (CESL) 58 and Inter-Layer Dielectric (ILD) 60. The respective process is illustrated as process 214 in the process flow 200 as shown in FIG. 25. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of a dielectric material, which may include silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 8:
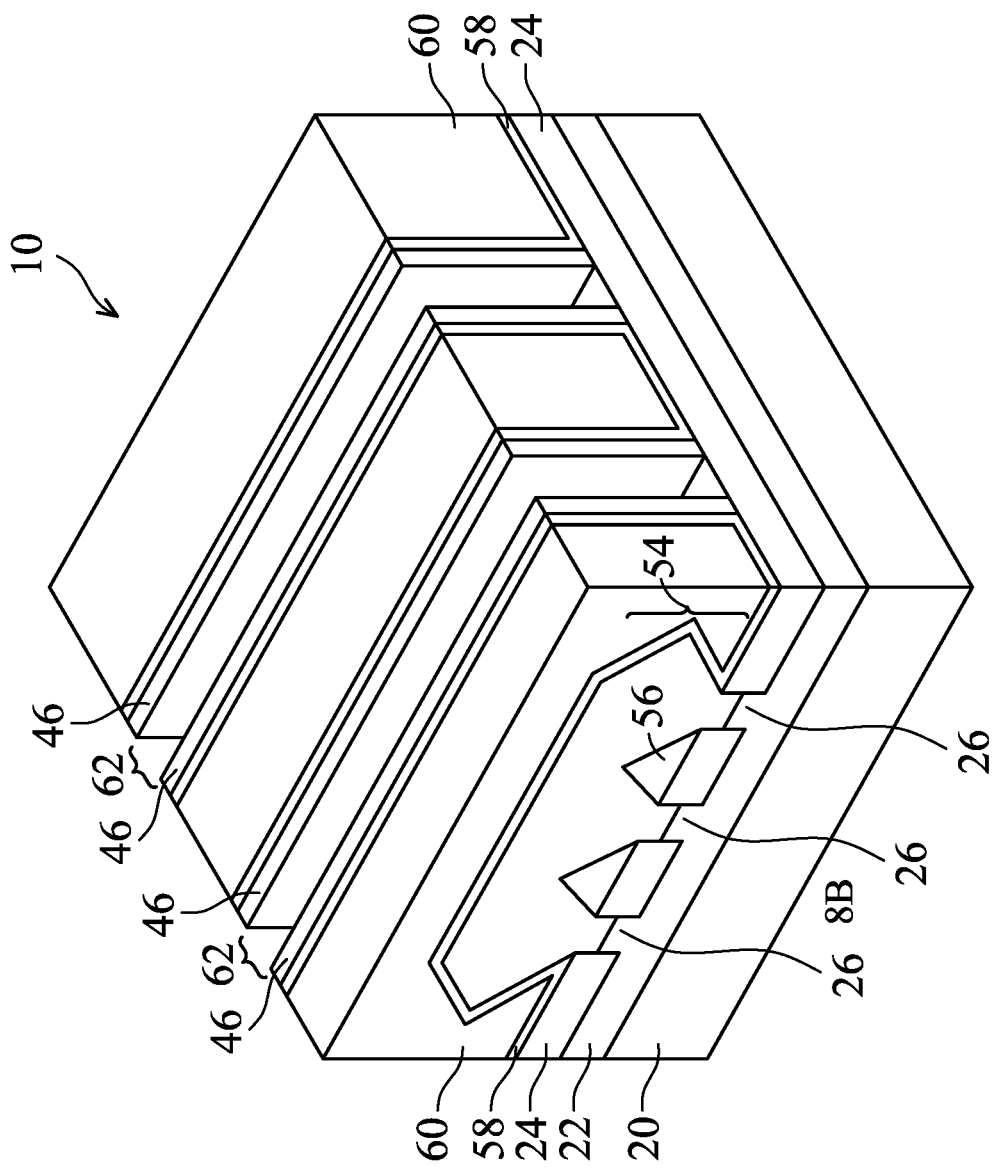
Figure 9A:
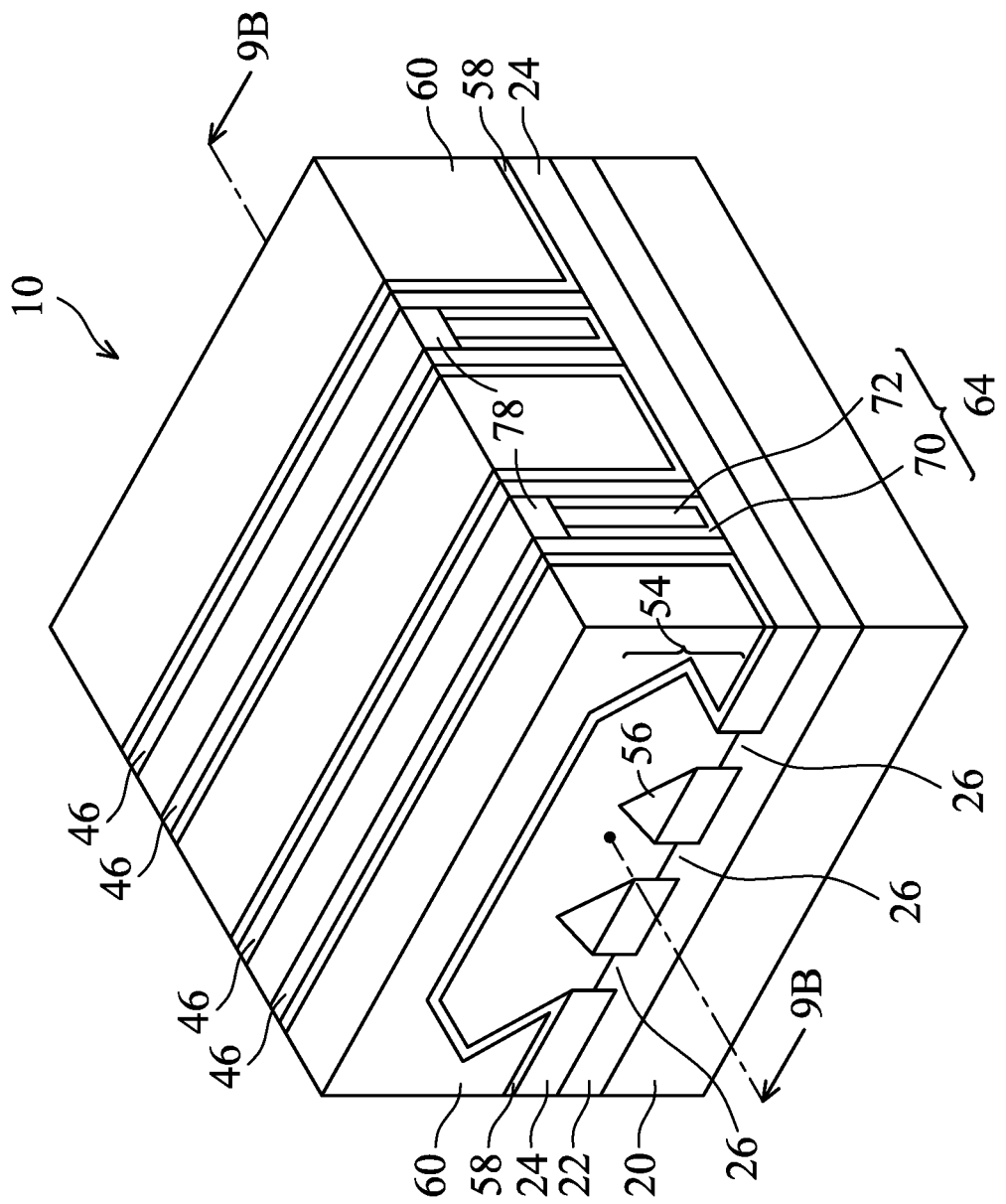
Figure 9B:
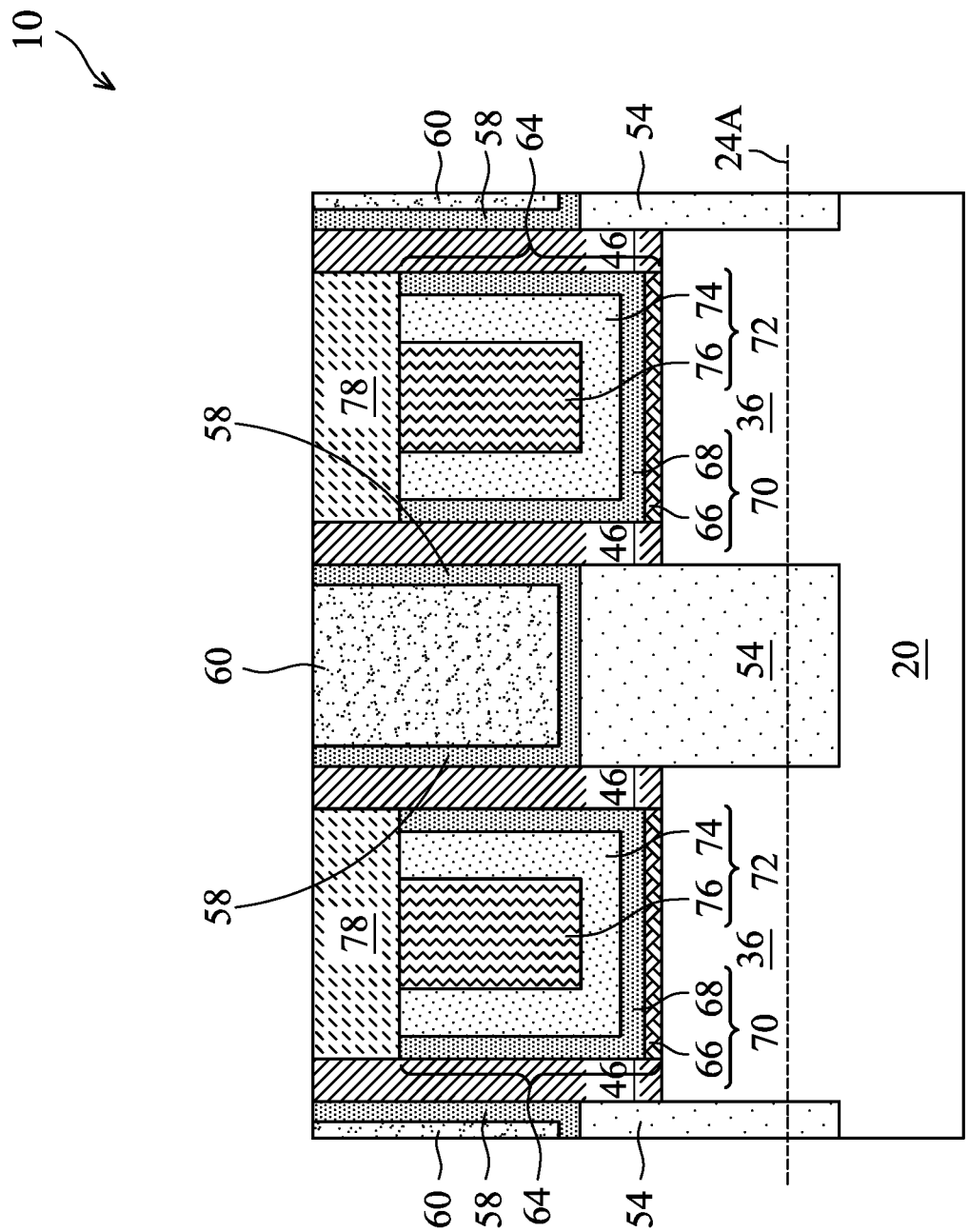

After the structure shown in FIG. 7 is formed, the dummy gate stacks 38 are replaced with replacement gates stacks, as shown in the processes in FIGS. 8, 9A, and 9B. In FIG. 9B, the top surface 24A of STI regions 24 are illustrated, and semiconductor fins 36 protrude higher than top surface 24A.

To form the replacement gates, hard mask layers 44, dummy gate electrodes 42, and dummy gate dielectrics 40 as shown in FIG. 7 are removed, forming openings 62 as shown in FIG. 8. The respective process is illustrated as process 216 in the process flow 200 as shown in FIG. 25. The top surfaces and the sidewalls of protruding fins 36 are exposed to openings 62, respectively.

FIGS. 9A and 9B illustrate the formation of replacement gate stacks 64 and self-aligned hard masks 78. FIG. 9B illustrates the reference cross-section 9B-9B as shown in FIG. 9A. As shown in FIGS. 9A and 9B, replacement gate stacks 64 are formed. The respective process is illustrated as process 218 in the process flow 200 as shown in FIG. 25. Gate stack 64 includes gate dielectric 70 and gate electrode 72. Gate dielectric 70 may include Interfacial Layer (IL) 66 and high-k dielectric layer 68 (FIG. 9B). IL 66 is formed on the exposed surfaces of protruding fins 36, and may include an oxide layer such as a silicon oxide layer, which is formed through the thermal oxidation of protruding fins 36, a chemical oxidation process, or a deposition process. High-k dielectric layer 68 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, high-k dielectric layer 68 is formed using ALD, CVD, or the like.

Referring further to FIGS. 9A and 9B, gate electrode 72 is formed on gate dielectric 70. Gate electrode 72 may include stacked layers 74 (FIG. 9B), which may include a diffusion barrier layer (a capping layer), and one or more work-function layer over the diffusion barrier layer. The diffusion barrier layer may be formed of titanium nitride, which may (or may not) be doped with silicon. Titanium nitride, when doped with silicon, is also sometimes referred to as titanium silicon nitride (Ti—Si—N, or TSN). The work-function layer determines the work-function of the gate electrode, and includes at least one layer, or a plurality of layers formed of different materials. The specific material of the work-function layer may be selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the capping layer and the work-function layer, a blocking layer, which may be another TiN layer, may be formed. The blocking layer may be formed using CVD.

Next, metal-filling region 76 is deposited, which has a bottom surface in physical contact with the top surface of blocking layer. The formation of metal-filling region 76 may be achieved through CVD, ALD, Physical Vapor Deposition (PVD), or the like, and metal-filling region 76 may be formed of or comprise cobalt, tungsten, alloys thereof, or other metal or metal alloys.

Next, a planarization such as a Chemical Mechanical Polish (CMP) process or a mechanical grinding process is performed, so that the top surface of gate stack 64 is coplanar with the top surface of ILD 60. In a subsequent process, gate stack 64 is etched back, resulting in a recess formed between opposite gate spacers 46. Next, hard mask 78 is formed over replacement gate stack 64. The respective process is illustrated as process 220 in the process flow 200 as shown in FIG. 25. In accordance with some embodiments of the present disclosure, the formation of hard mask 78 includes a deposition process to form a blanket dielectric material, and a planarization process to remove the excess dielectric material over gate spacers 46 and ILD 60. Hard mask 78 may be formed of silicon nitride, for example, or other like dielectric materials.

Figure 10A:
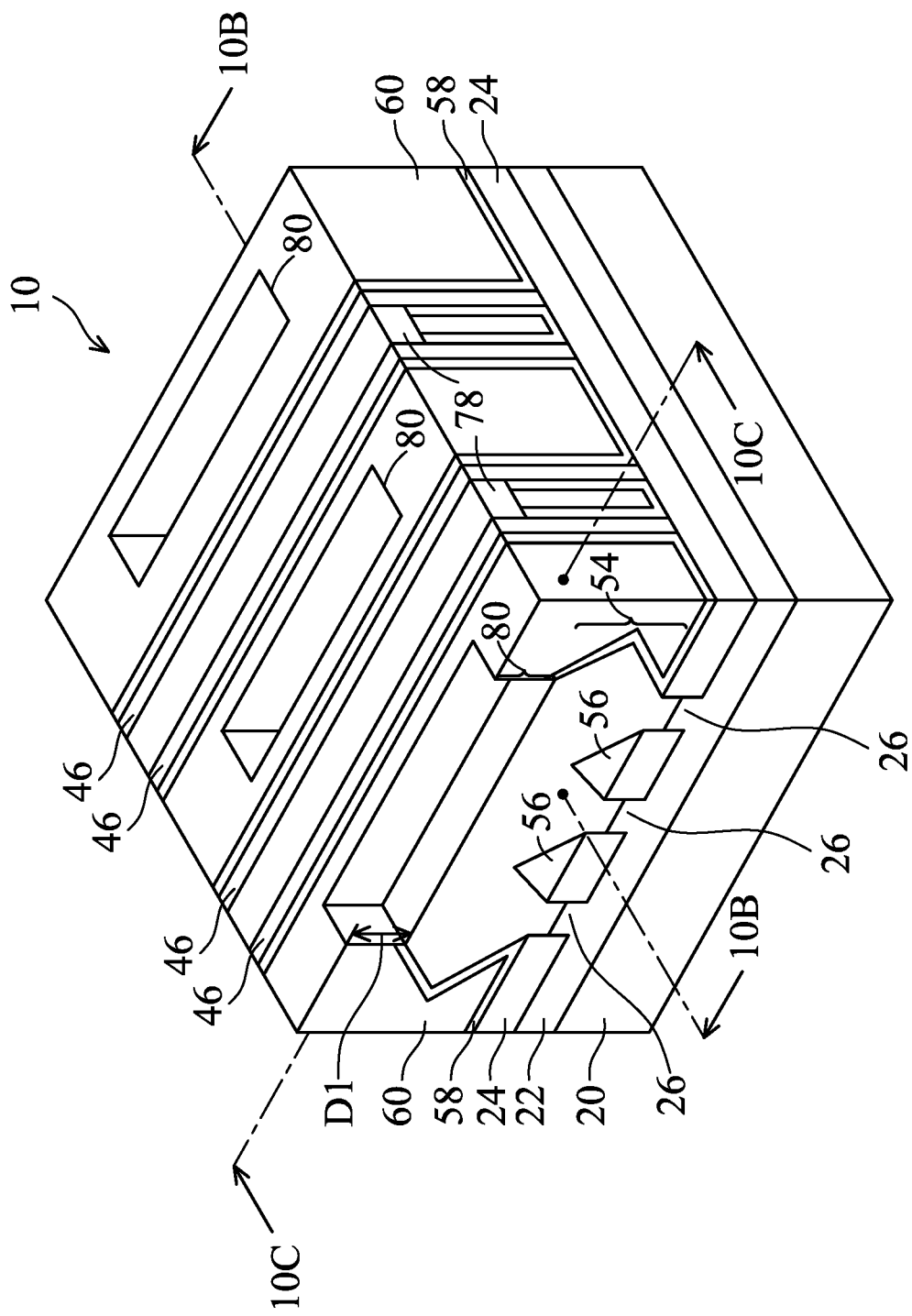
Figure 10B:
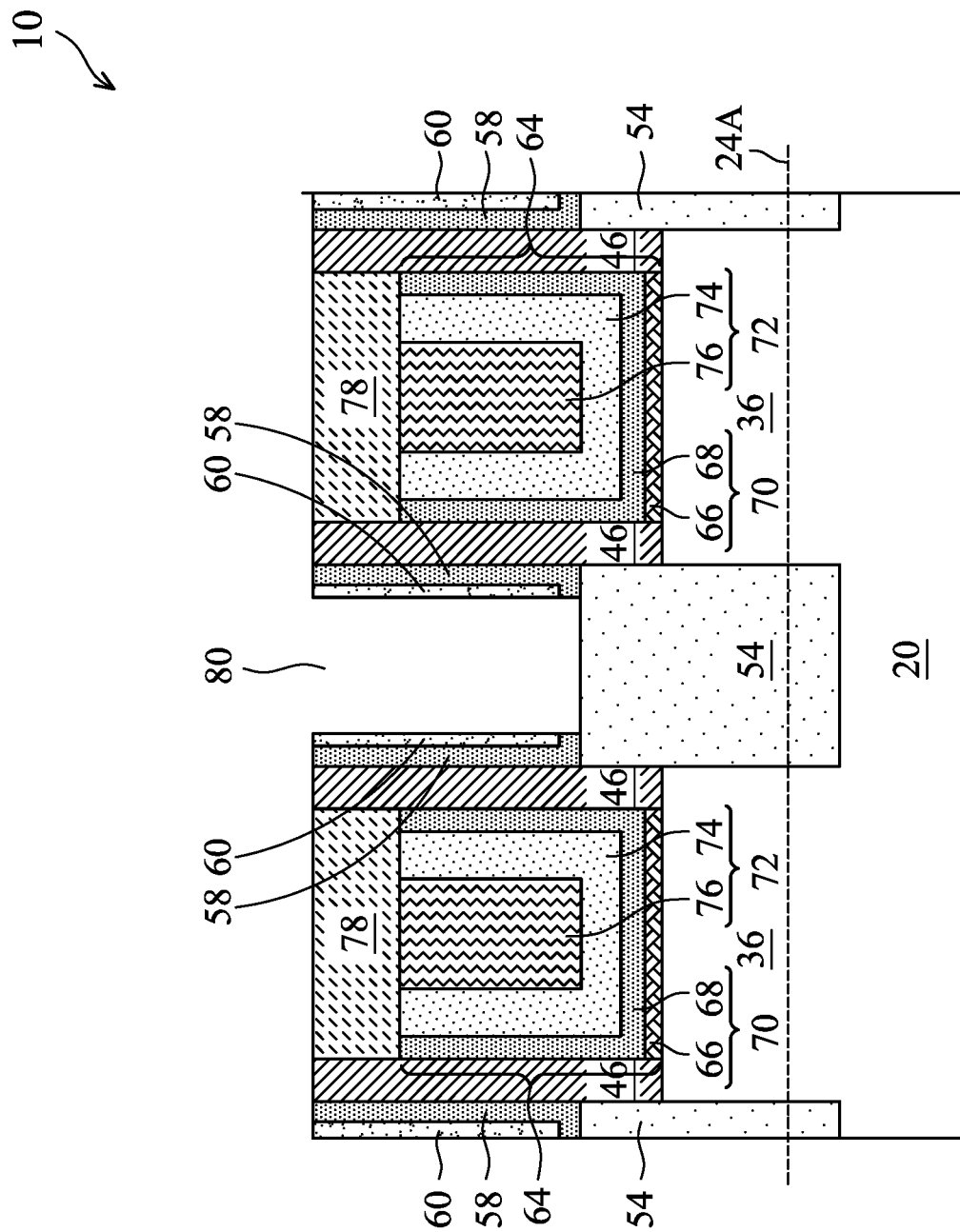

FIGS. 10A and 10B illustrate the formation of source/drain contact openings 80, which are formed by etching ILD 60 and CESL 58. The respective process is illustrated as process 222 in the process flow 200 as shown in FIG. 25. Accordingly, epitaxy regions 54 are exposed. FIG. 10B illustrates the reference cross-section 10B-10B as shown in FIG. 10A. In accordance with some embodiments, depth D1 of source/drain contact openings 80 is greater than about 80 nm, and may be in the range between about 80 nm and about 200 nm in accordance with some embodiments.

Figure 11:
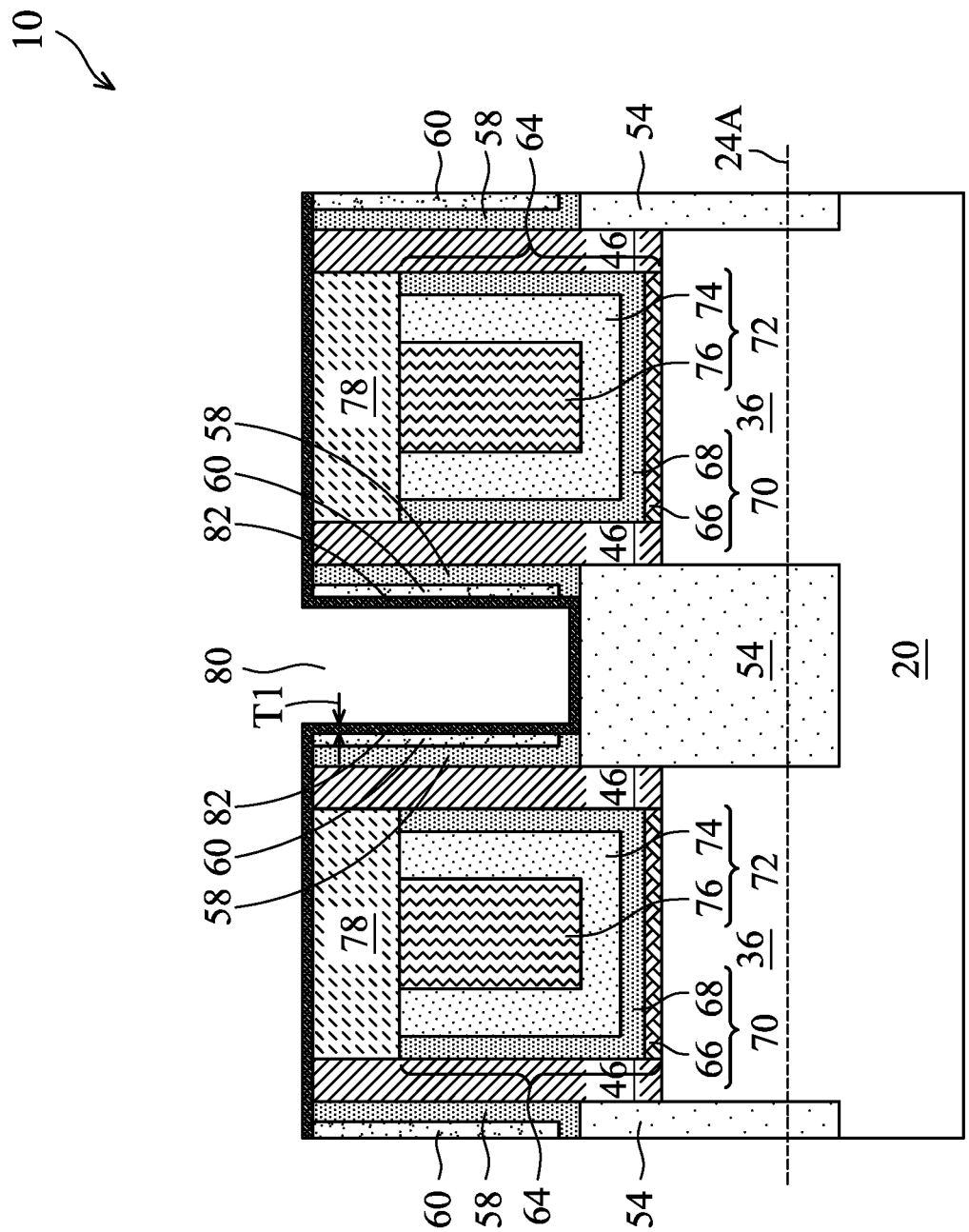

Next, referring to FIG. 11, sacrificial layer 82 is deposited. The respective process is illustrated as process 224 in the process flow 200 as shown in FIG. 25. The material of sacrificial layer is selected so that it has adequately high etching selectivity (for example, higher than about 100) relative to all of the exposed materials that are exposed in the process shown in FIG. 18A. For example, the exposed materials include ILD 60, CESL 58, gate spacers 46, hard mask 78, metal filling region 90, and silicide region 88. In accordance with some embodiments of the present disclosure, depending on the materials of the exposed regions/layers, the sacrificial layer is selected to have a high etching selectivity over silicon oxide, SiOCN, cobalt, SiN, tungsten, TiSi, and the like, so that when sacrificial layer 82 is removed, these materials are substantially undamaged. In accordance with some embodiments of the present disclosure, sacrificial layer 82 comprises silicon, and may be free from other elements such as germanium, p-type impurity, n-type impurity, and the like therein. Sacrificial layer 82 may be amorphous, or may be polysilicon. In subsequent paragraphs, sacrificial layer 82 is referred to as dummy silicon layer 82, while it may also be formed of other materials.

The formation of dummy silicon layer 82 is performed using a conformal deposition method, for example, with the difference between the horizontal thickness of the horizontal portions and the vertical thickness of the vertical portions being smaller than about 20 percent of either of the horizontal thickness and vertical thickness. In accordance with some embodiments, the deposition method includes Atomic Layer Deposition (ALD) (such as radical-enhanced ALD), Chemical Vapor Deposition (CVD), or the like. The thickness T1 of dummy silicon layer 82 is selected to achieve optimum result. When thickness T1 is too small, the intended effect, which is to reduce parasitic capacitance, is too small. Furthermore, when thickness T1 is too small, it is difficult to remove dummy silicon layer 82 to form the air spacer. On the other hand, if T1 is too big, the size of the resulting transistor is increased too much, and/or the allowed width for the subsequently filled metal region 90 is squeezed. In accordance with some embodiments of the present disclosure, the thickness T1 is in the range between about 1.5 nm and about 3.0 nm.

Figure 12:
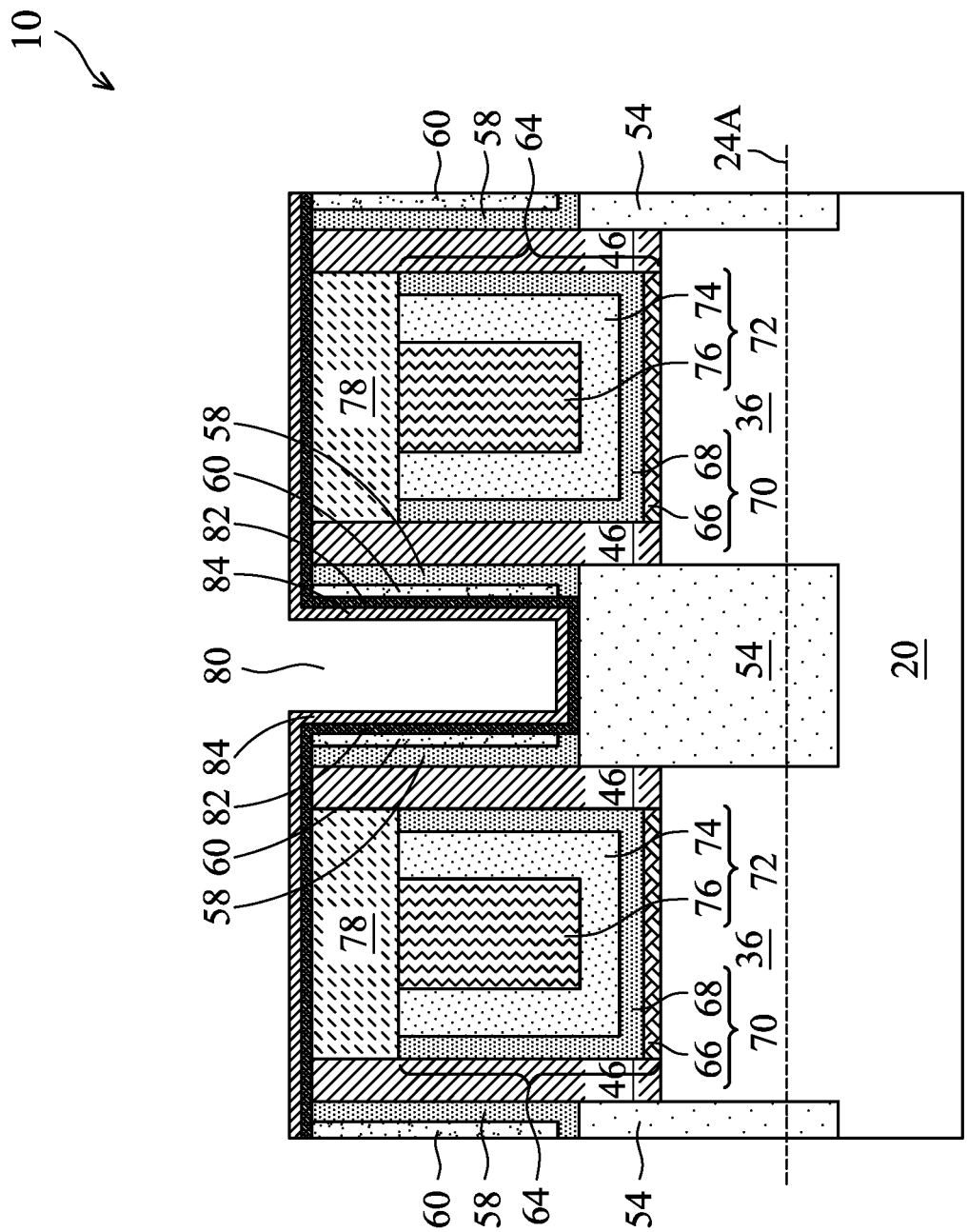

Referring to FIG. 12, isolation layer 84 is deposited, for example, using ALD, CVD, or the like. The respective process is illustrated as process 226 in the process flow 200 as shown in FIG. 25. Isolation layer 84 may be formed of a dielectric material such as silicon nitride, silicon oxynitride, or the like. Isolation layer 84 is also formed as a conformal layer. Isolation layer 84 is used to physically isolate dummy silicon layer 82 from the subsequently deposited capping layer 86 that may react with dummy silicon layer 82 to form silicide.

Figure 13:
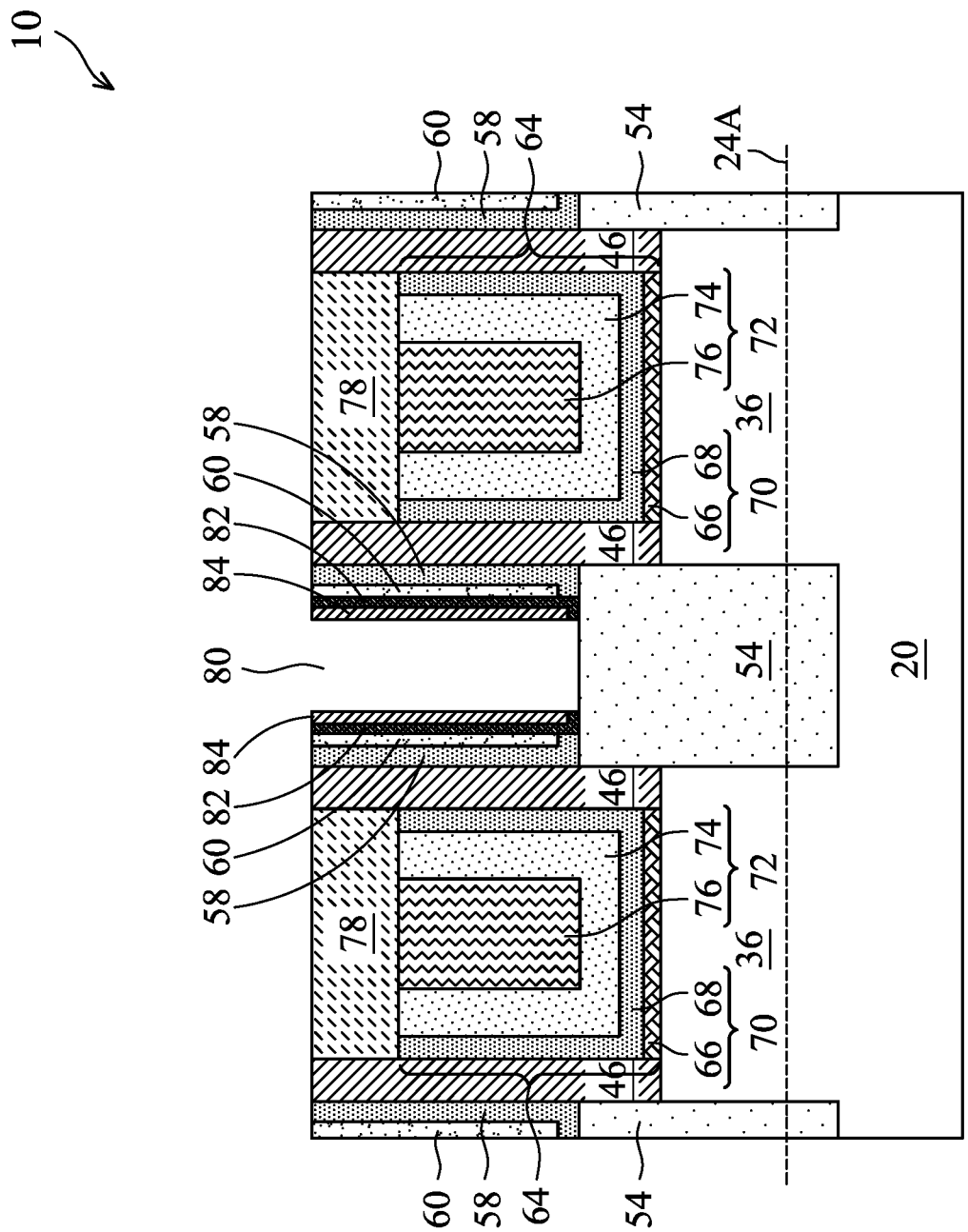

In a subsequent process, as shown in FIG. 13, an anisotropic etching process is performed to remove the horizontal portions of isolation layer 84 and dummy silicon layer 82. As a result, epitaxy region 54 is exposed. The respective process is illustrated as process 228 in the process flow 200 as shown in FIG. 25.

Figure 14A:
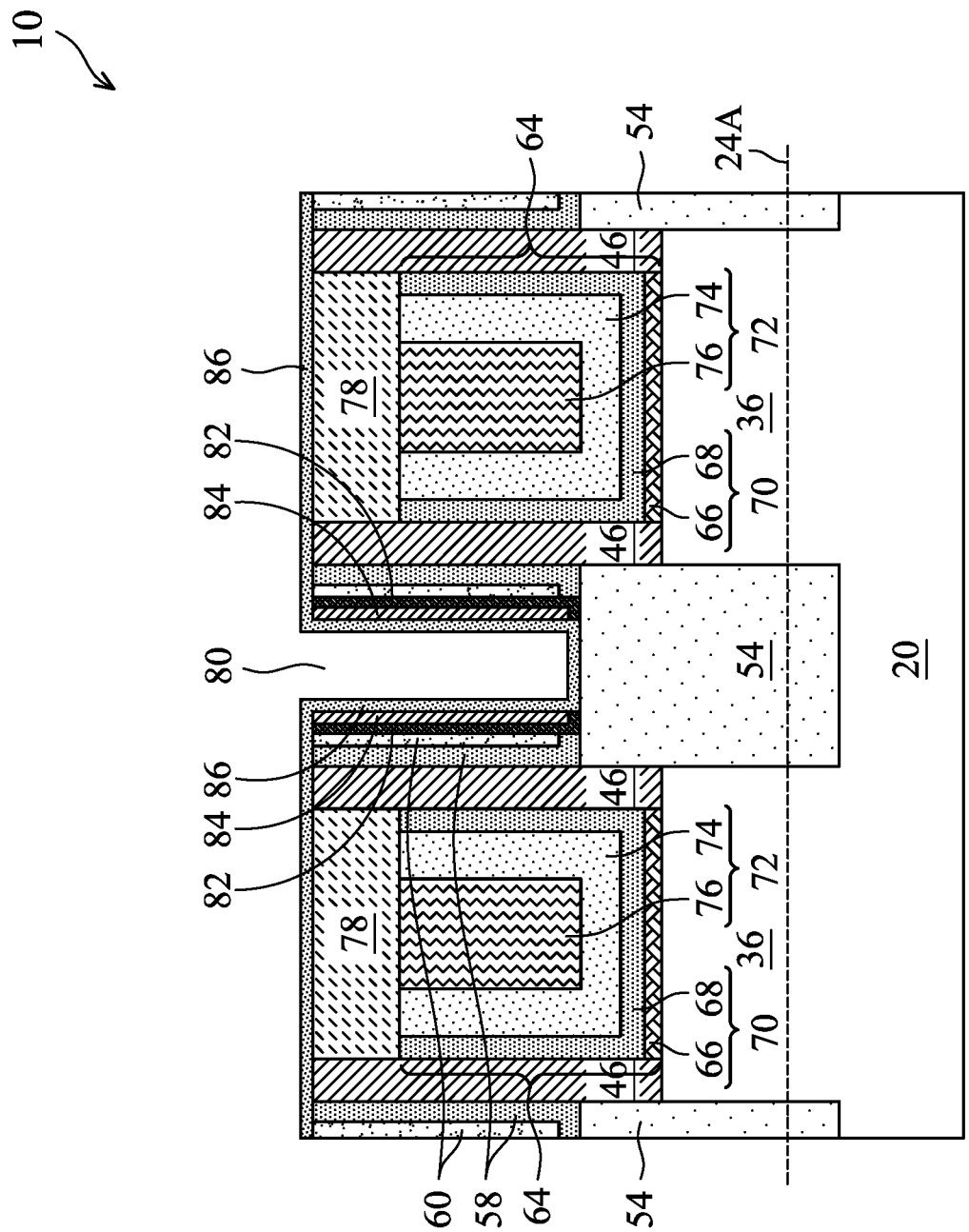
Figure 14B:
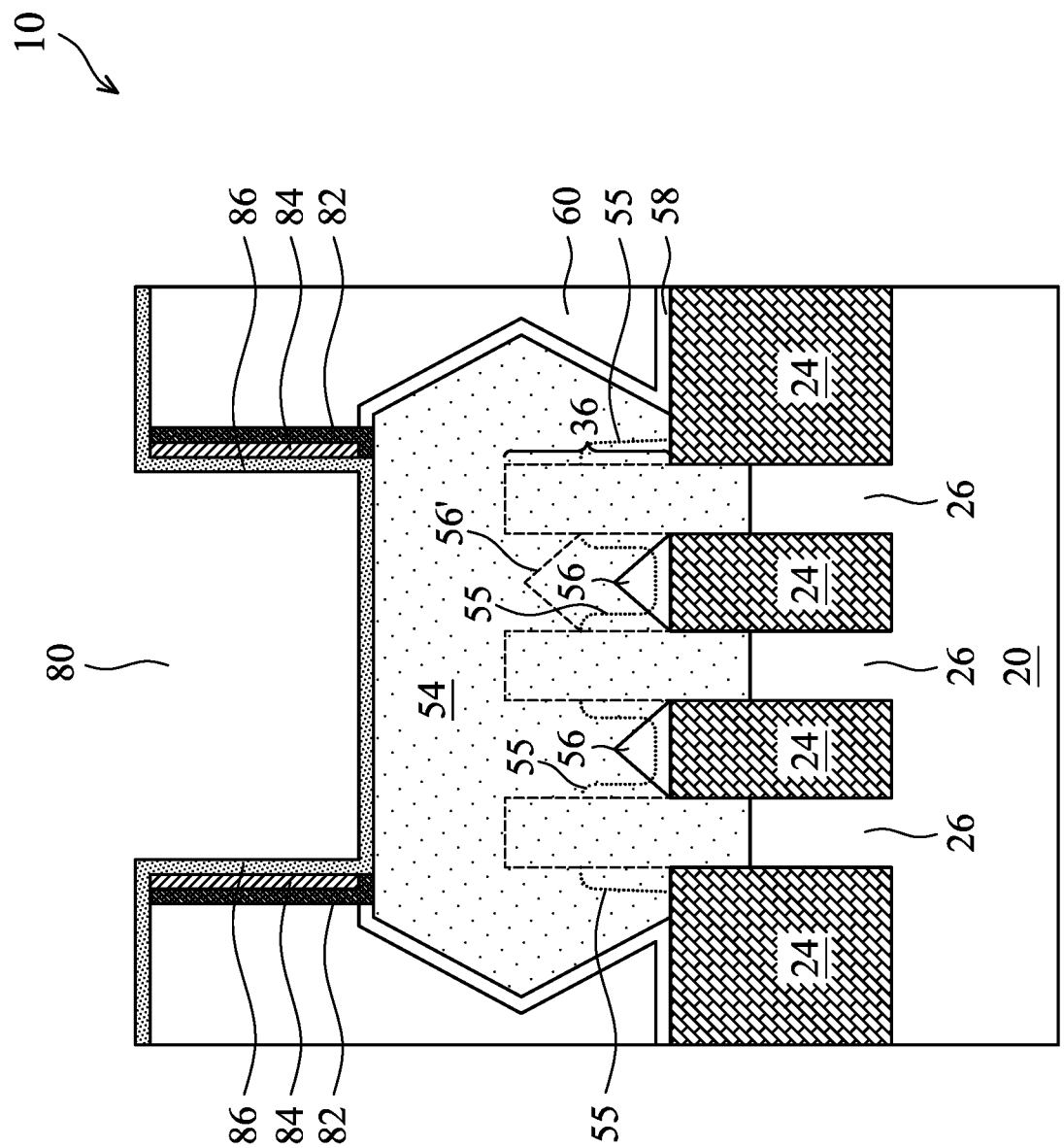

FIGS. 14A and 14B illustrate the formation of capping layer 86. The respective process is illustrated as process 230 in the process flow 200 as shown in FIG. 25. FIG. 14A illustrates the reference cross-section obtained along the source-to-drain direction, which may be the same reference cross-section 10B-10B as shown in FIG. 10A. Capping layer 86 may be or comprise a titanium nitride layer, which may be a titanium-rich layer having a high atomic percentage of titanium, for example, higher than about 80 percent. In accordance with alternative embodiments, capping layer 86 includes a metal layer (such as a titanium layer) and a metal-nitride-based layer over the metal layer. The metal-nitride-based layer may be formed of or comprise titanium nitride, tantalum nitride, or the like. Capping layer 86 may be formed through deposition, for example, using ALD, CVD, or the like. In accordance with alternative embodiments, capping layer 86 is formed by depositing a metal layer, and then nitriding a surface layer of the metal layer, leaving the bottom layer of the metal layer not nitridated. Capping layer 86 may be a conformal layer in accordance with some embodiments of the present disclosure.

FIG. 14B illustrates the reference cross-section obtained along the gate-length direction, which may be the same reference cross-section 10C-10C as shown in FIG. 10A. FIG. 14B also schematically illustrates fin spacers 55, which are formed in the same process for forming gate spacers 46. The formation of fin spacers 55 may cause epitaxy regions 54 to start growing at a higher position, and may cause voids 56 to be larger, for example, as represented by dashed lines 56'.

Figure 15:
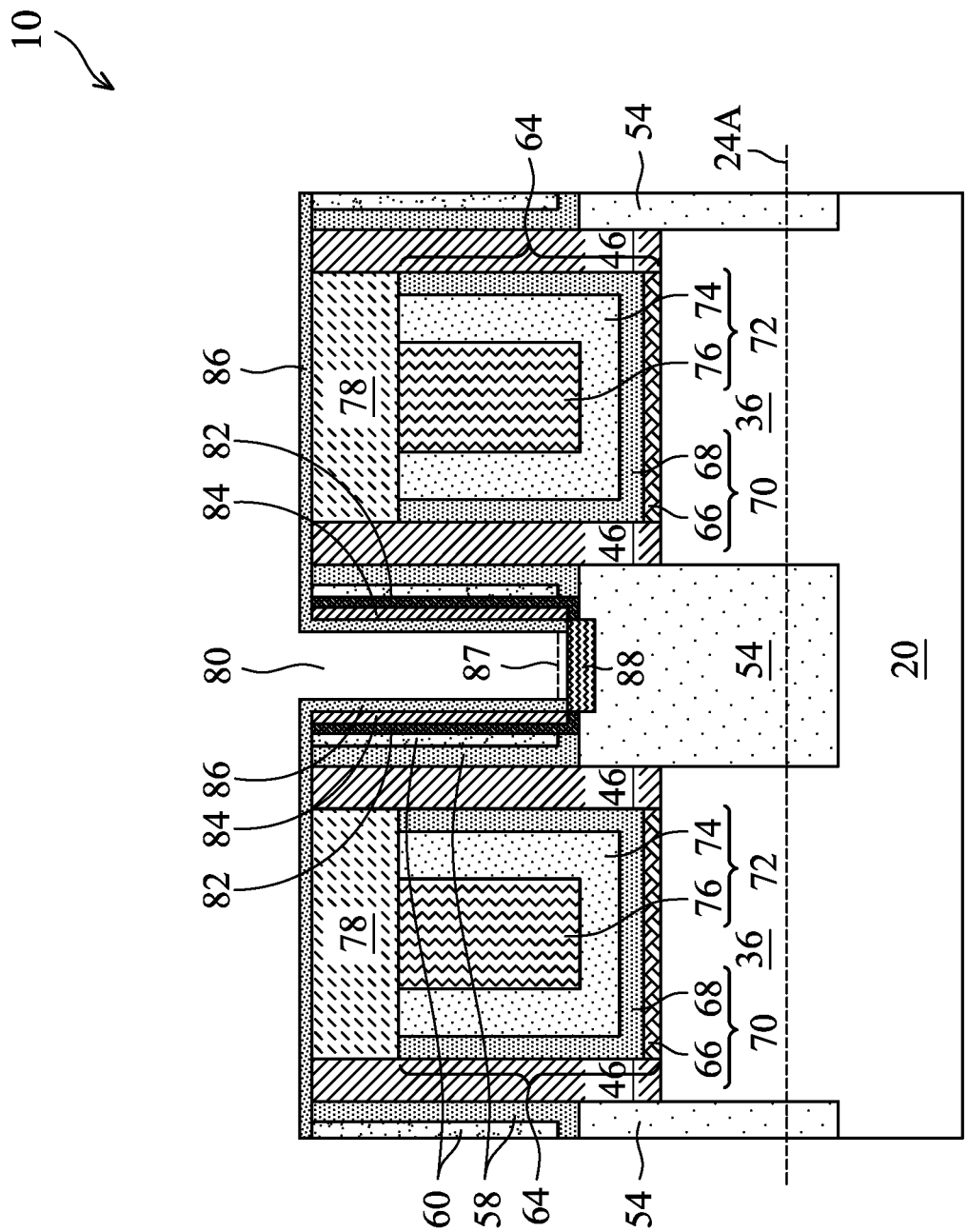

An annealing process is then performed to form source/drain silicide region 88, as shown in FIG. 15. The respective process is illustrated as process 232 in the process flow 200 as shown in FIG. 25. The annealing process may be performed through Rapid Thermal Anneal (RTA), furnace anneal, or the like. Accordingly, the bottom portion of capping layer 86 reacts with dummy silicon layer 82 and the underlying source/drain region to form metal silicide region 88 (for example, TiSi or TiSiN), which may or may not include nitrogen. Source/drain silicide region 88 may have opposing sidewalls flush with the inner edges of the overlying remaining isolation layer 84, or may extend laterally to be directly underlying the remaining vertical portions of isolation layer 84 and dummy silicon layer 82.

Figure 16:
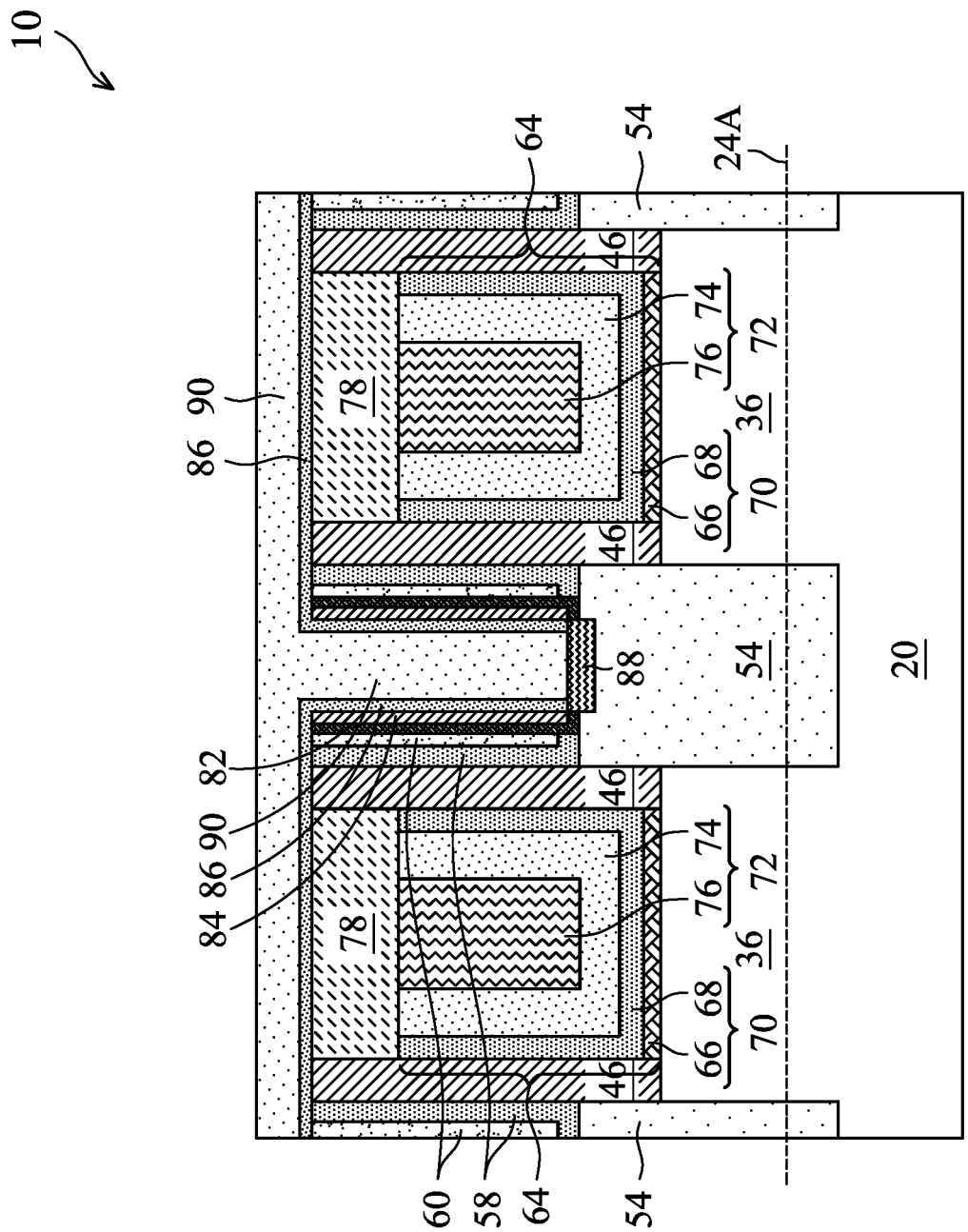

In subsequent processes, capping layer 86 may be pulled back first to make the top portion of opening 80 wider, followed by the formation of another capping layer, which may be formed of TiN, for example. The additional capping layer will be conformal and has a horizontal portion at the bottom of opening 80, as represented by the dashed layer 87. In accordance with other embodiments, the pull-back is not performed. If the pull-back is performed, the lower portions of capping layer 86 will be thicker than the corresponding upper portions. In accordance with some embodiments, the pull-back process includes filling a sacrificial material such as photo resist into opening 80, etching back the sacrificial material until its surface is lower than the top surface of ILD 60, etching the capping layer 86 using the sacrificial material as an etching mask, and then removing the sacrificial material. The top end of the remaining capping layer 86 may be at an intermediate level between the top surface and the bottom surface of ILD 60. An additional capping layer is then formed. In accordance with alternative embodiments, as shown in FIG. 16, no additional capping layer is formed. In accordance with some embodiments, the additional capping layer is formed of titanium nitride, tantalum nitride, or the like. In FIG. 15, the remaining capping layer 86 left by the pull-back process is not illustrated separately.

Figure 17:
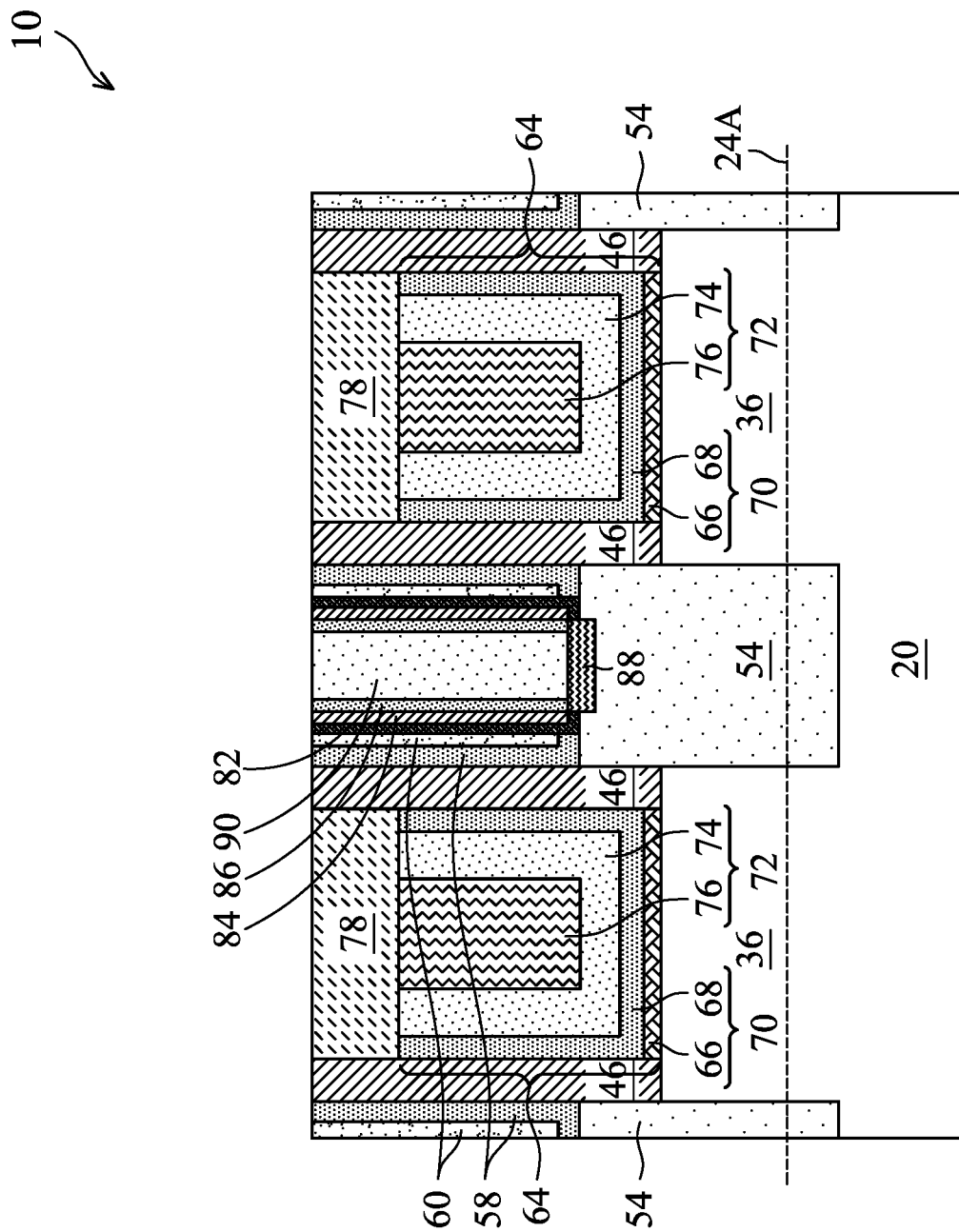

Next, as shown in FIG. 16, metallic material 90 is deposited over and in contact with capping layer 86, and filling opening 80. The respective process is illustrated as process 234 in the process flow 200 as shown in FIG. 25. Metallic material 90 may be formed of or comprise cobalt, tungsten, or the like, or the alloys of these metals. Next, as shown in FIG. 17, a planarization process such as a CMP process or a mechanical grinding process is performed to remove the portions of capping layer 86 and metallic material 90 over the top surface of ILD 60. Dummy silicon layer 82 is thus exposed.

Figure 18A:
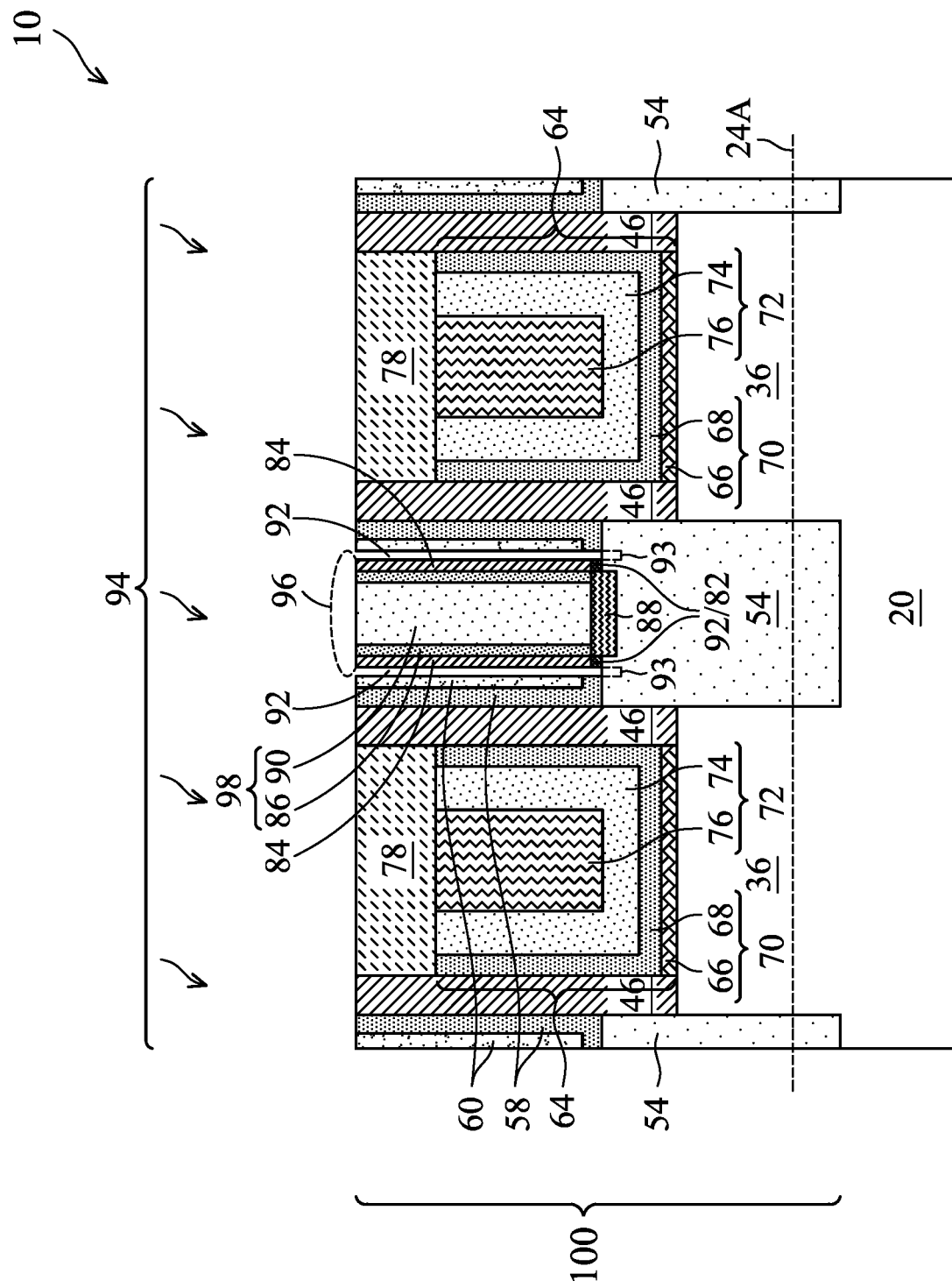
Figure 18B:
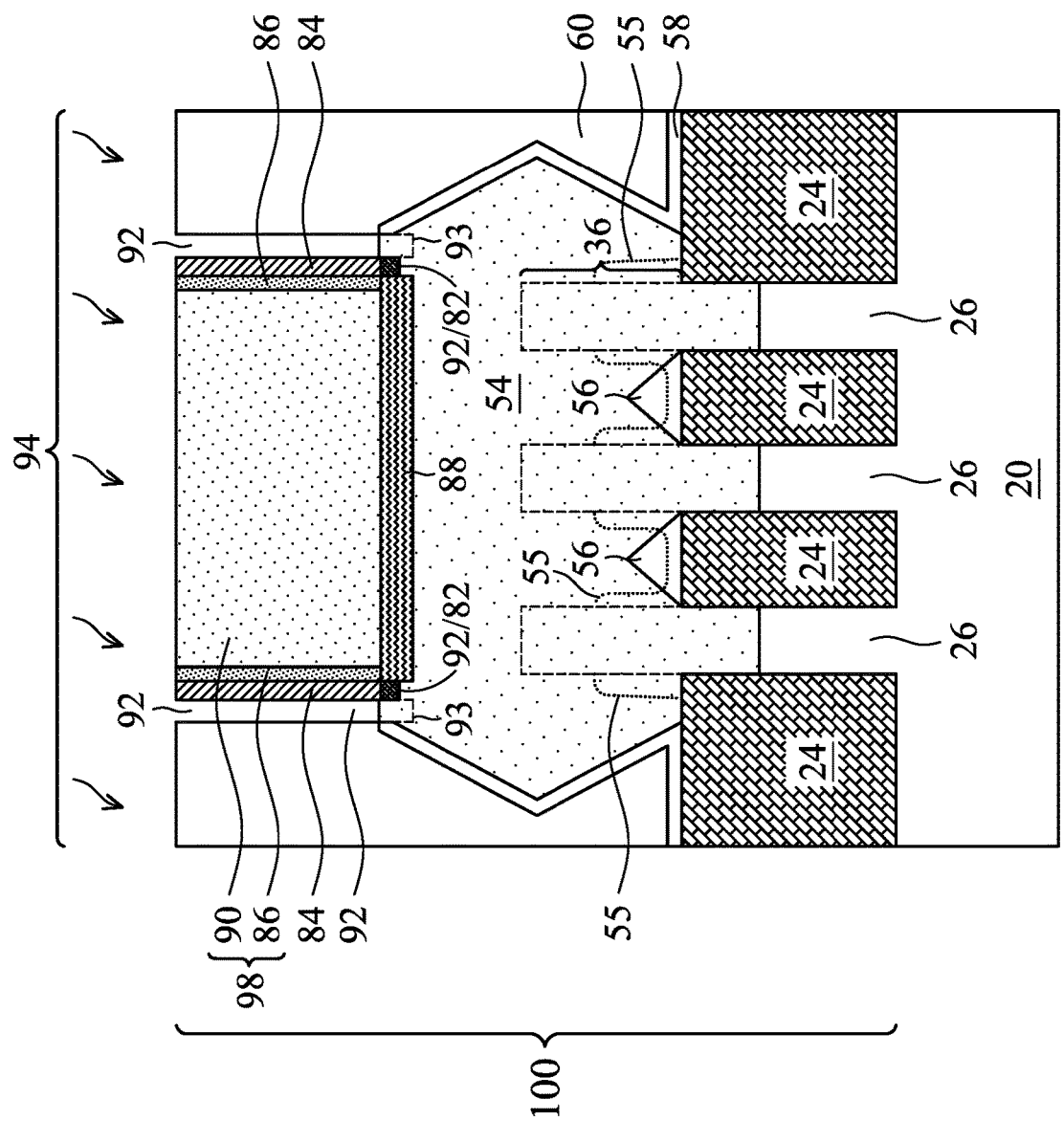

FIGS. 18A and 18B illustrate the removal of dummy silicon layer 82 through an etching process in order to form air spacer 92. The respective process is illustrated as process 236 in the process flow 200 as shown in FIG. 25. FIG. 18A illustrates the reference cross-section obtained along the source-to-drain direction, which may be the same reference cross-section 10B-10B as shown in FIG. 10A. FIG. 18B illustrates the reference cross-section obtained along the gate-length direction, which may be the same reference cross-section 10C-10C as shown in FIG. 10A. The etching process is represented by arrows 94.

In accordance with some embodiments, the etching process 94 is performed using a mixed gas of hydrogen ($H_2$) and Nitrogen tri-fluoride ($NF_3$). Other gases such as $N_2$, Ar, He, or combinations thereof may also be added. In accordance with some embodiments, during the etching, the pressure in the etching chamber may be in the range between about 200 mTorr and about 5,000 mTorr. The temperature of wafer 10 may be in the range between about 10° C. and about 120° C. The flow rate of hydrogen may be in the range between about 100 sccm and about 5,000 sccm, and the flow rate of $NF_3$ may be in the range between about 5 sccm and about 100 sccm. The flow rate of $N_2$ may be in the range between about 0 sccm and about 5,000 sccm. The flow rate of Ar may be in the range between about 0 sccm and about 1,000 sccm. The flow rate of He may be in the range between about 0 sccm and about 4,000 sccm. The etching may be performed using remote plasma, and ions of the etching gases are removed through filtering, while the radicals of the etching gases are left and used to etch dummy silicon layer 82. This reduces the damage of the exposed regions.

Experiment results have revealed that the using of $NF_3$ may cause the formation of metal fluoride on the surface of metal region 90. The metal fluoride is schematically illustrated as region 96 in FIG. 18A. For example, when metal region 90 is formed of or comprises cobalt, metal fluoride region 96 comprises cobalt fluoride ($CoF_x$). If the metal fluoride is formed, with the proceeding of the etching of dummy silicon layer 82, the metal fluoride region 96 grows thicker and expands laterally. It is likely that the laterally expanded metal fluoride region 96 seals the entrance of air spacers 92 before dummy silicon layer 82 is fully removed (and air gaps 92 are fully developed). As a result, the bottom portions of dummy silicon layer 82 are not able to be removed. This adversely reduces the intended effect of reducing parasitic capacitance. The experiment results also indicated that by increasing the ratio $FR(H_2)/FR(HF_3)$, which is the flow rate ratio of the hydrogen flow rate $FR(H_2)$ to $HF_3$ flow rate $FR(HF_3)$, the thickness of metal fluoride region 96 reduces. The increase in the flow rate ratio $FR(H_2)/FR(HF_3)$ means the relative amount of $HF_3$, which is the source gas for forming metal fluoride, is reduced. With the reduction in the thickness of metal fluoride region 96, the possibility of the pre-mature sealing of air gaps 92 is reduced. Experiment results indicated that when the flow rate ratio $FR(H_2)/FR(HF_3)$ is equal to 0.44, 2.0, and 28, noticeable metal fluoride region 96 with thickness in the range between about 6 nm and about 9 nm have been observed, which are significant enough to pre-mature seal air spacers 92 before air spacers 92 are fully developed. On the other hand, when flow rate ratio $FR(H_2)/FR(HF_3)$ is equal to 41 or greater, no distinguishable metal fluoride region 96 was found (for example, through Transmission electron microscopy (TEM)), and air spacers 92 are fully developed, with dummy silicon layer 82 fully removed. It is appreciated that the ratio $FR(H_2)/FR(HF_3)$ cannot be too high either. Otherwise, the etching rate of dummy silicon layer 82 is too small or even unable to be etched. In accordance with some embodiments of the present disclosure, the flow rate ratio $FR(H_2)/FR(HF_3)$ is in the range between 41 and about 44.

The increase in the flow rate ratio $FR(H_2)/FR(HF_3)$ may also increase the etching selectivity of dummy silicon layer 82 to other exposed regions, so that the exposed regions are etched (damaged) less. The ratios of the etching rate of dummy silicon layer 82 to the etching rates of gate spacers 46, CESL 58, ILD 60, metal region 90, capping layer 86, isolation layer 84, and silicide region 88 may be increased, for example, to higher than about 100. Accordingly, when dummy silicon layer 82 is fully removed, these regions are substantially undamaged.

When dummy silicon layer 82 is fully removed, the underlying region, which may be silicide region 88 or epitaxy region 54, is exposed. In accordance with some embodiments, a thin oxide layer (not shown) may be developed on the surface of epitaxy region 54 or silicide region 88 to prevent the etching of epitaxy region 54. The thin oxide layer, although observed as being at the bottom of dummy silicon layer 82, was not observed in the final structure. If silicide region 88 is exposed, silicide region 88 also stops the further etching. In accordance with other embodiments, epitaxy region 54 is etched slightly, and hence air spacer 92 extends down into epitaxy region 54, and dashed lines 93 schematically illustrates the positions of the air spacer 92.

In FIGS. 18A and 18B, there is a region directly underlying isolation layer 84, and the region is marked as "92/82," which means that this region may be parts of air spacer 92 or has residue dummy layer 82 remaining. In accordance with some embodiments, the portions of dummy silicon layer 82 directly underlying isolation layer 84 are removed, and air spacers 92 extends into these regions. In accordance with alternative embodiments, at least some portions of dummy silicon layer 82 directly underlying isolation layer 84 are left un-etched, and dummy silicon layer 82 are left in the final structure. In accordance with some embodiments, air spacer 92 has an irregular shape, for example, with upper portions of air spacers 92 being wider than the respective underlying portions. When residue dummy layer 82 exists, residue dummy layer 82 may have an irregular shape, for example, with lower portions of residue dummy layer 82 being wider than the respective upper portions.

Figure 18C:
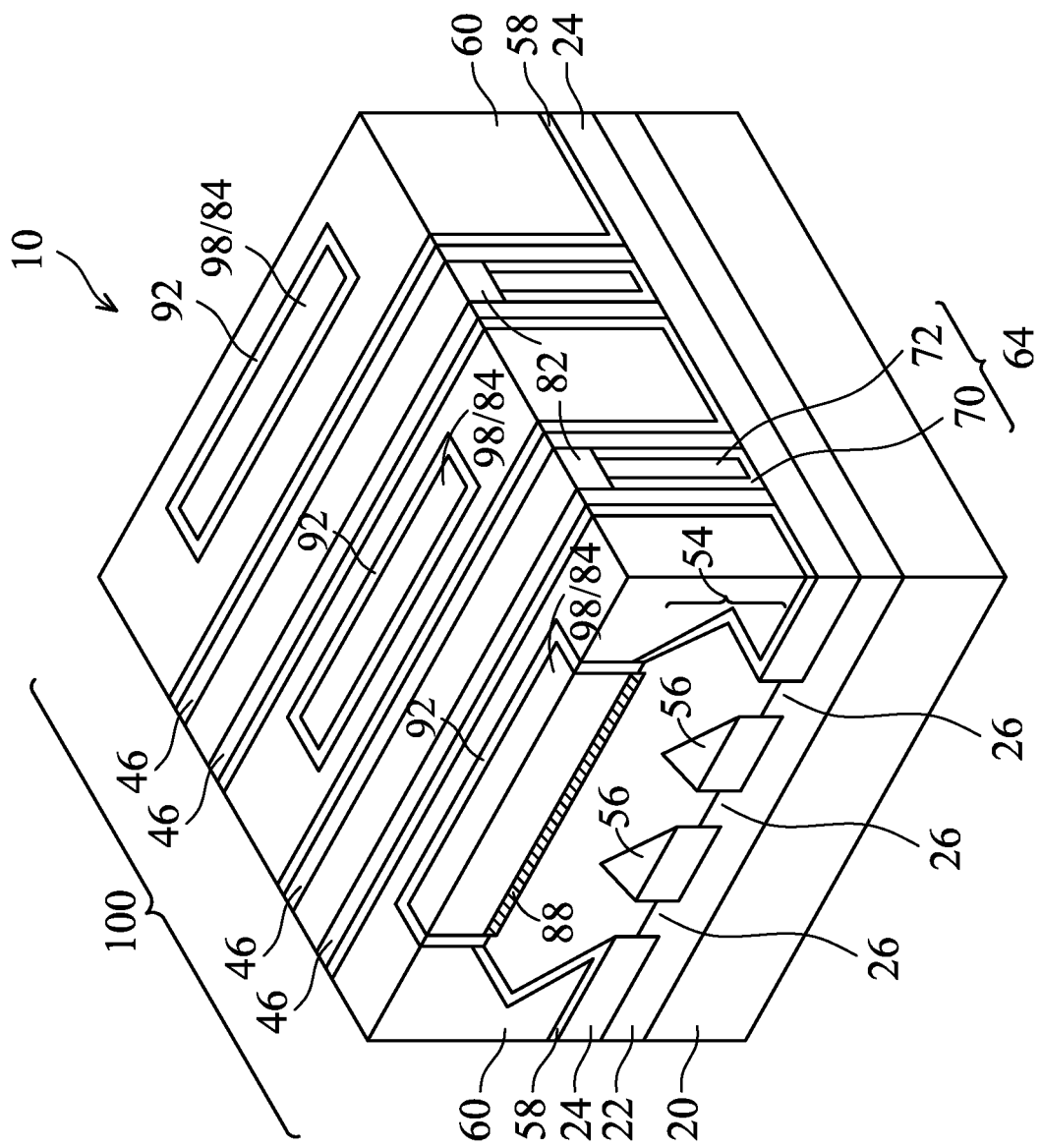
Figure 18D:
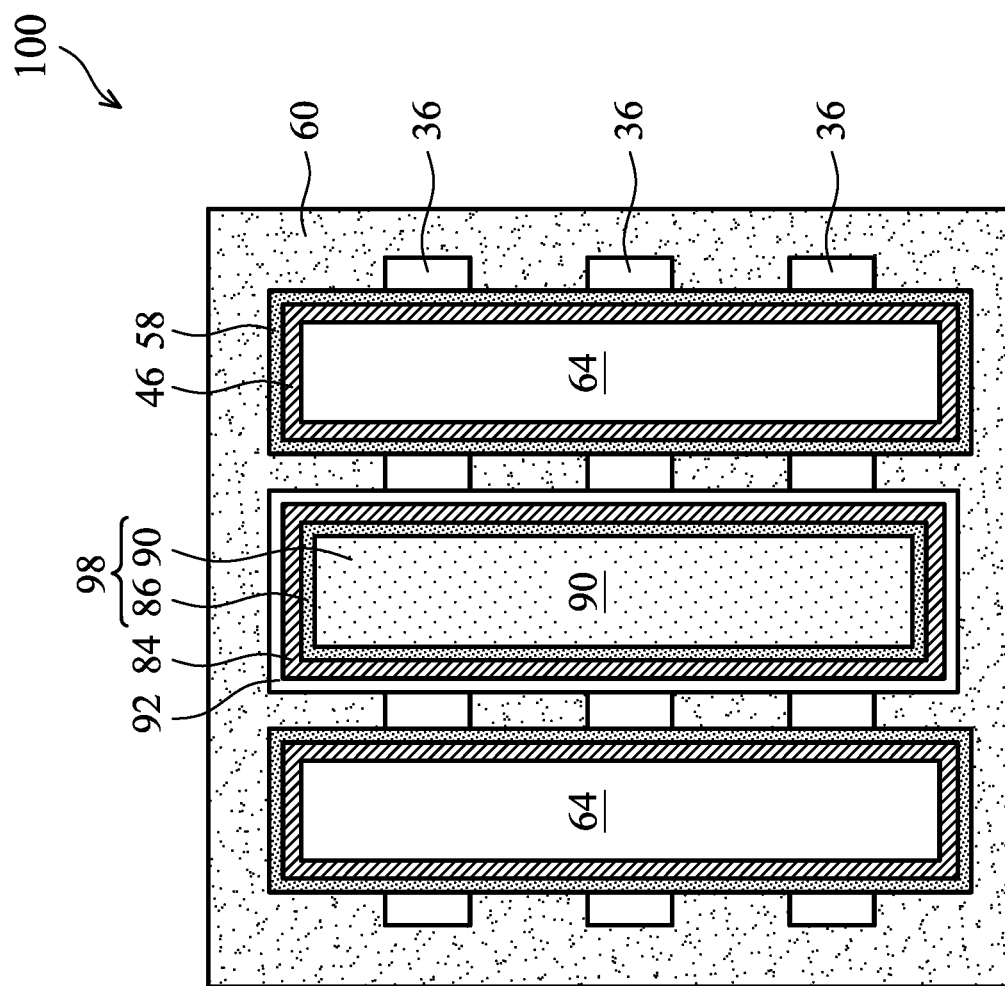

In the resulting structure as shown in FIGS. 18A and 18B, source/drain contact plug 98 is formed, which includes capping layer 86 and metal region 90. Isolation layer 84 encircles contact plug 98, and is further encircled by air spacer 92, which also forms a ring. FIG. 18C illustrates a perspective view, which shows the air spacers 92 and source/drain contact plugs 98. FIG. 18D illustrates a top view, which shows that air spacer 92 forms a full ring encircling isolation layer 84 and source/drain contact plug 98. Isolation layer 84 and capping layer 86 are also formed as rings. FinFET 100 is thus formed.

Figure 19A:
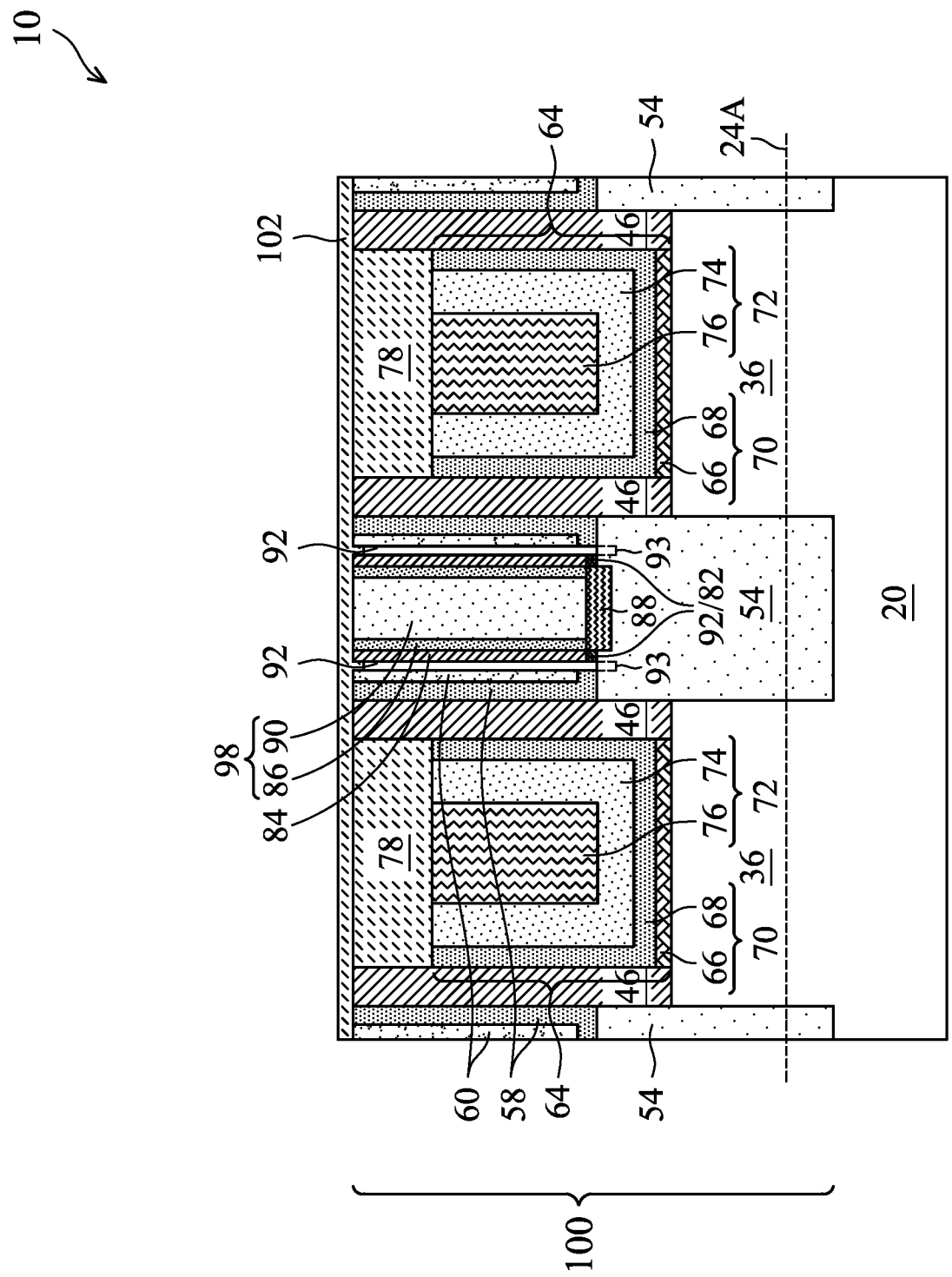
Figure 19B:
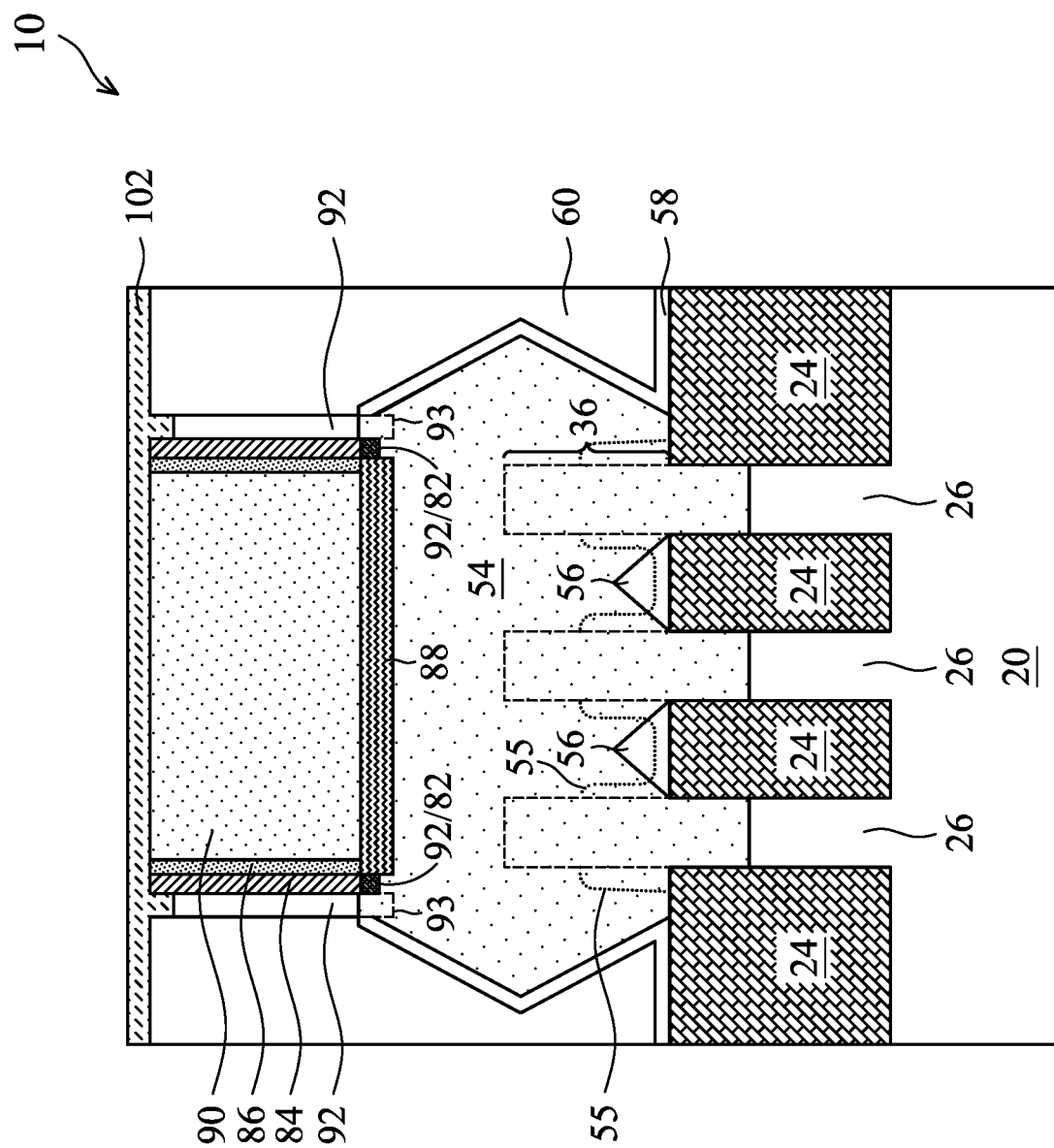

FIGS. 19A and 19B illustrate the formation of etch stop layer 102, which is formed of a dielectric material such as silicon carbide, silicon oxynitride, silicon carbo-nitride, or the like. The respective process is illustrated as process 238 in the process flow 200 as shown in FIG. 25. FIG. 19A illustrates the reference cross-section obtained along the source-to-drain direction, and FIG. 19B illustrates the reference cross-section obtained along the gate-length direction. The formation of etch stop layer 102 may be performed using a non-conformal and a non-bottom-up method such as SiN, SiOCN, or the like, so that etch stop layer 102 seals air spacers 92 without filling it. Etch stop layer 102 may extend slightly into the previously formed air spacers 92.

Figure 20:
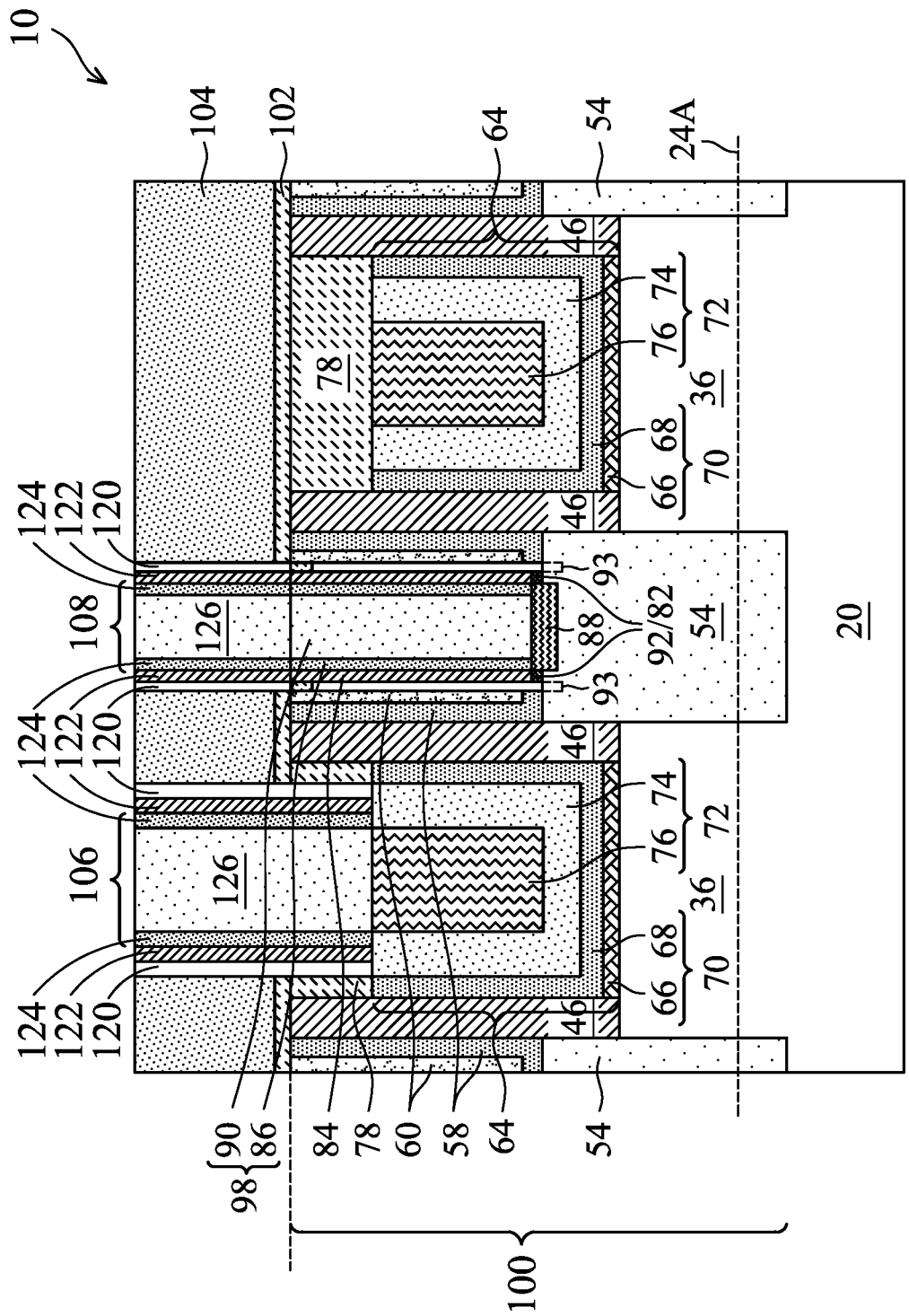

Referring to FIG. 20, dielectric layer 104 is formed. Dielectric layer 104 may include a material selected from PSG, BSG, BPSG, Fluorine-doped Silicon Glass (FSG), silicon oxide, or the like. Dielectric layer 104 may be formed using spin-on coating, FCVD, or the like, or formed using a deposition method such as PECVD or Low Pressure Chemical Vapor Deposition (LPCVD). Dielectric layer 104 and etch stop layer 102 are etched to form openings (occupied by plugs/vias 106 and 108). The etching may be performed using, for example, Reactive Ion Etch (RIE). Contact plugs/vias 106 and 108 are formed in the openings. In accordance with some embodiments of the present disclosure, air spacers 120 are formed to encircle contact plugs/vias 106 and 108. In accordance with some embodiments of the present disclosure, plugs/vias 106 and 108 are formed using processes and materials selected from the same candidate processes and materials for forming source/drain contact plug 98. For example, the formation process may include depositing a silicon layer (not shown), isolation layer 122, and capping layer 124, anisotropic etching of the silicon layer and the isolation layer 122, and filling metal region 126. The annealing process is skipped since no silicide regions are to be formed. In accordance with alternative embodiments, isolation layer 122 is skipped, and capping layer 124 is exposed to air spacers 120.

In subsequent processes, a planarization process is performed. An additional etch stop layer and an additional dielectric layer are then formed to seal air spacers 120 therein. Capping layer 124 may be formed of or comprise Ti, TiN, Ta, TaN, or the like. Metal regions 126 may be formed of tungsten, cobalt, or the like.

Figure 21:
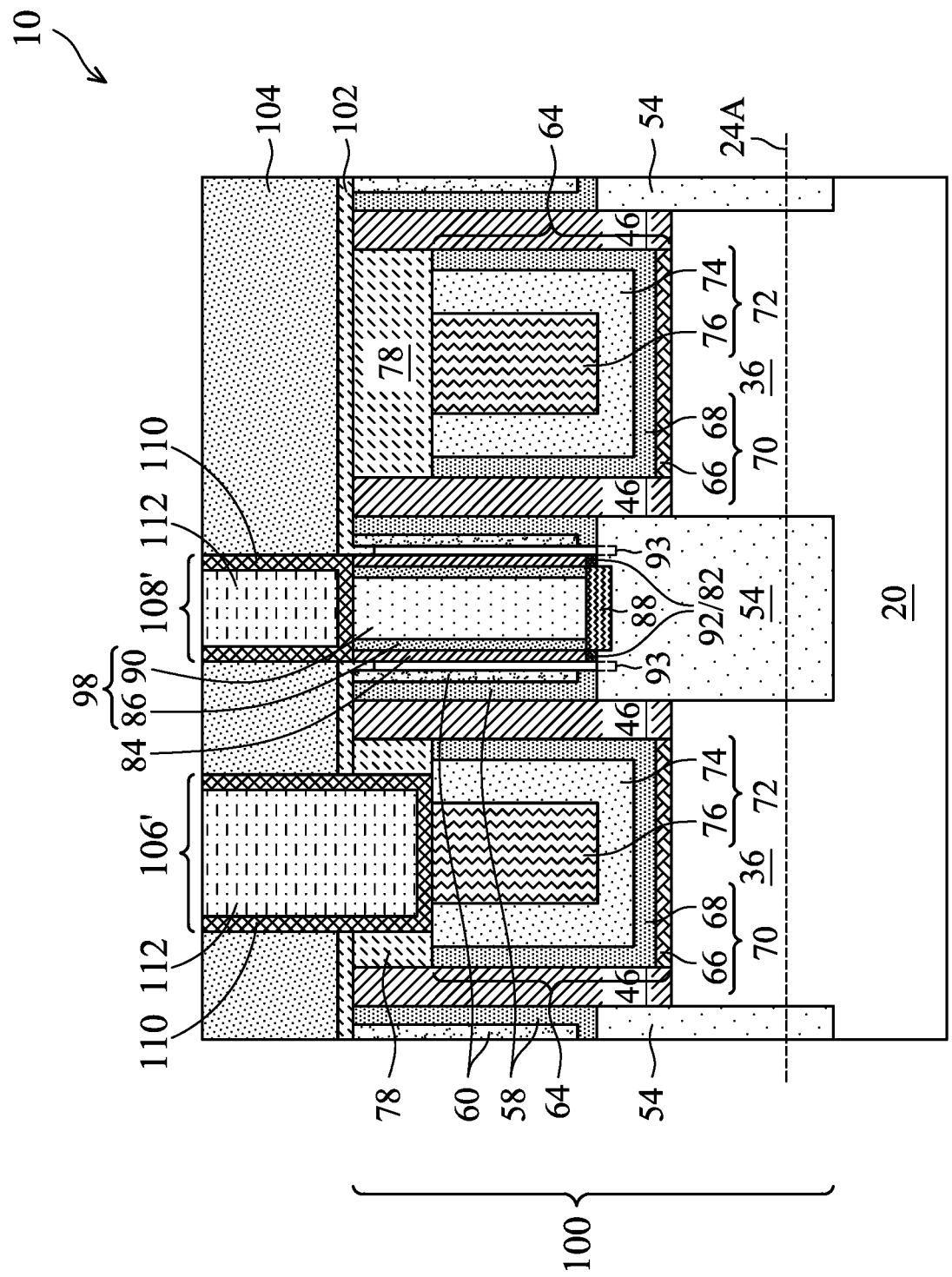
FIGS. 21 through 24 illustrate FinFETs and contact plugs, and air spacers in accordance with some embodiments.

FIG. 21 illustrates FinFET 100 and the corresponding air spacer in accordance with alternative embodiments. These embodiments are similar to the embodiments in FIG. 20, except that no air spacers are formed in the contact plugs/vias that extend into dielectric layer 104. In accordance with some embodiments of the present disclosure, plugs/vias 106' and 108' include barrier layer 110 and metal-containing material 112 over barrier layer 110. In accordance with some embodiments of the present disclosure, the formation of plugs/vias 106' and 108' includes etching layers 102 and 104 to form contact openings, forming a blanket barrier layer and a metal-containing material over the blanket barrier layer, and performing a planarization process to remove excess portions of the blanket barrier layer and the metal-containing material. Barrier layer 110 may be formed of or comprise Ti, TiN, Ta, TaN, or the like. Metal-containing material 112 may be formed of copper, tungsten, cobalt, or the like.

Figure 22:
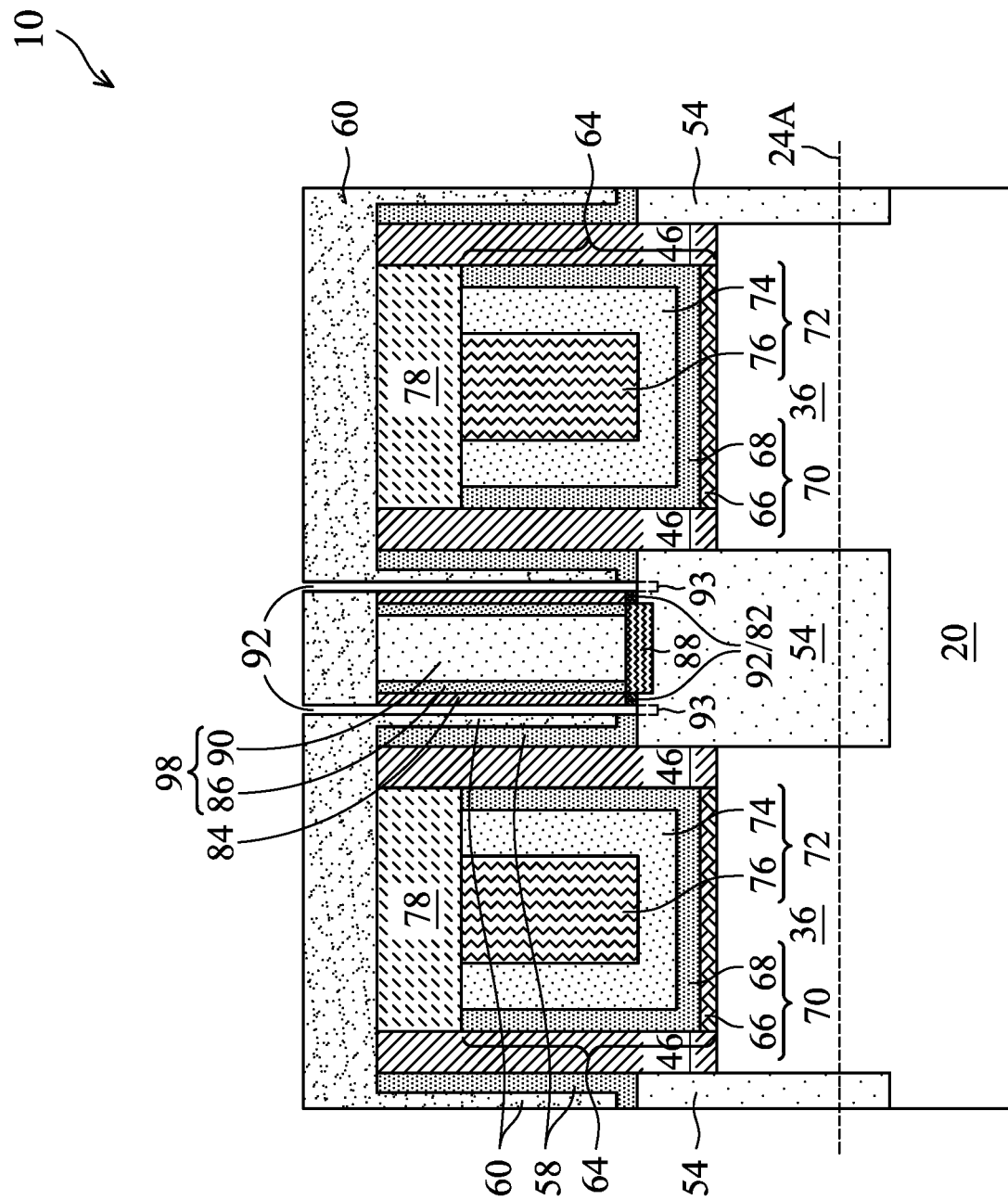
Figure 23:
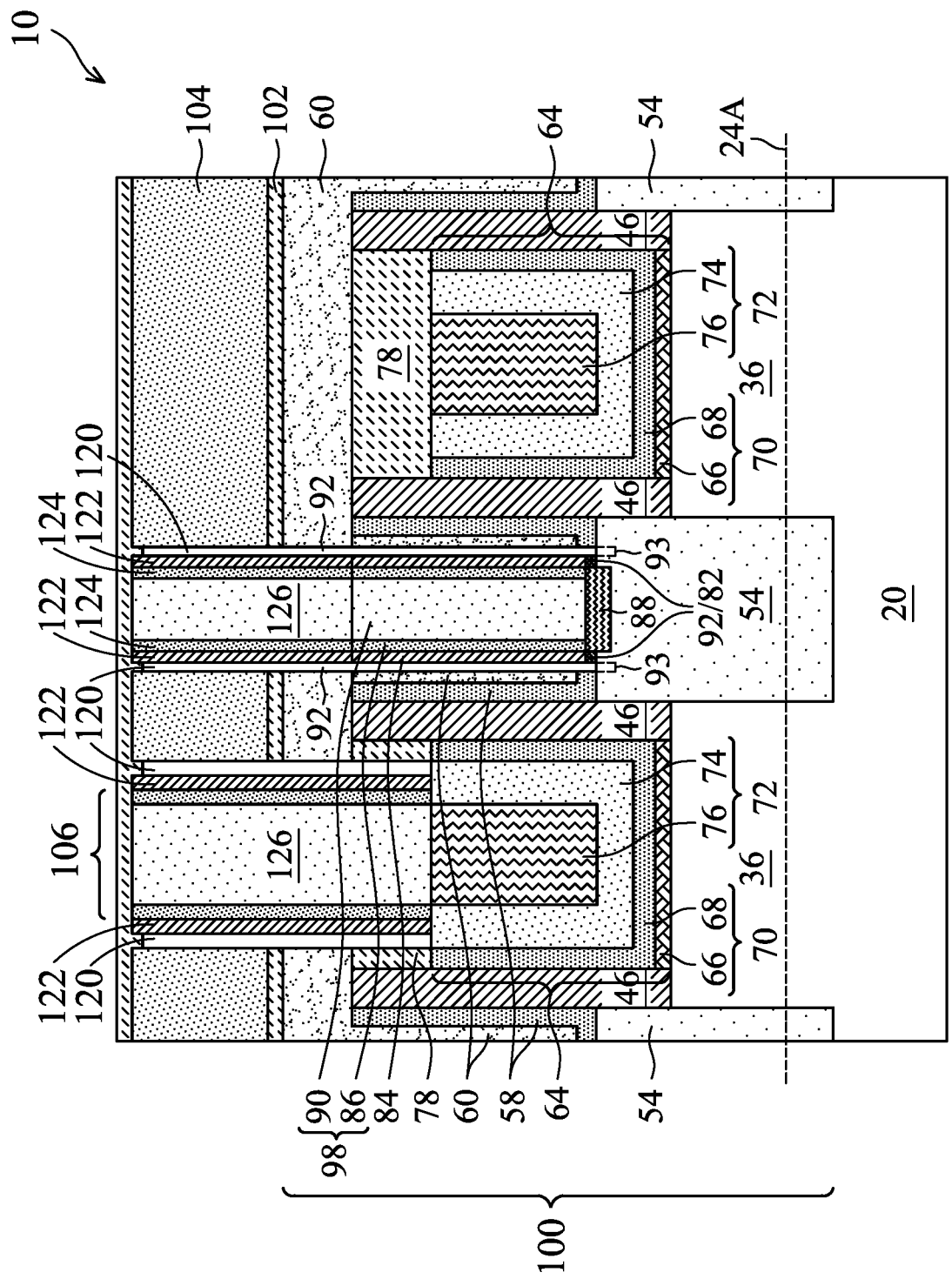

FIGS. 22 and 23 illustrate the formation of a structure in accordance with alternative embodiments. These embodiments are similar to the embodiments shown in FIGS. 16A, 16B, 16C, and 16D, except that ILD 60 has extra portions extending higher than gate spacers 46, gate stack 64, and hard mask 78. Air spacers 92 are accordingly extend into the extra portions of ILD 60. FIG. 22 illustrates the process in which air spacer 92 is formed by etching the corresponding silicon layer, and FIG. 23 illustrates the formation of additional overlying features.

Figure 24:
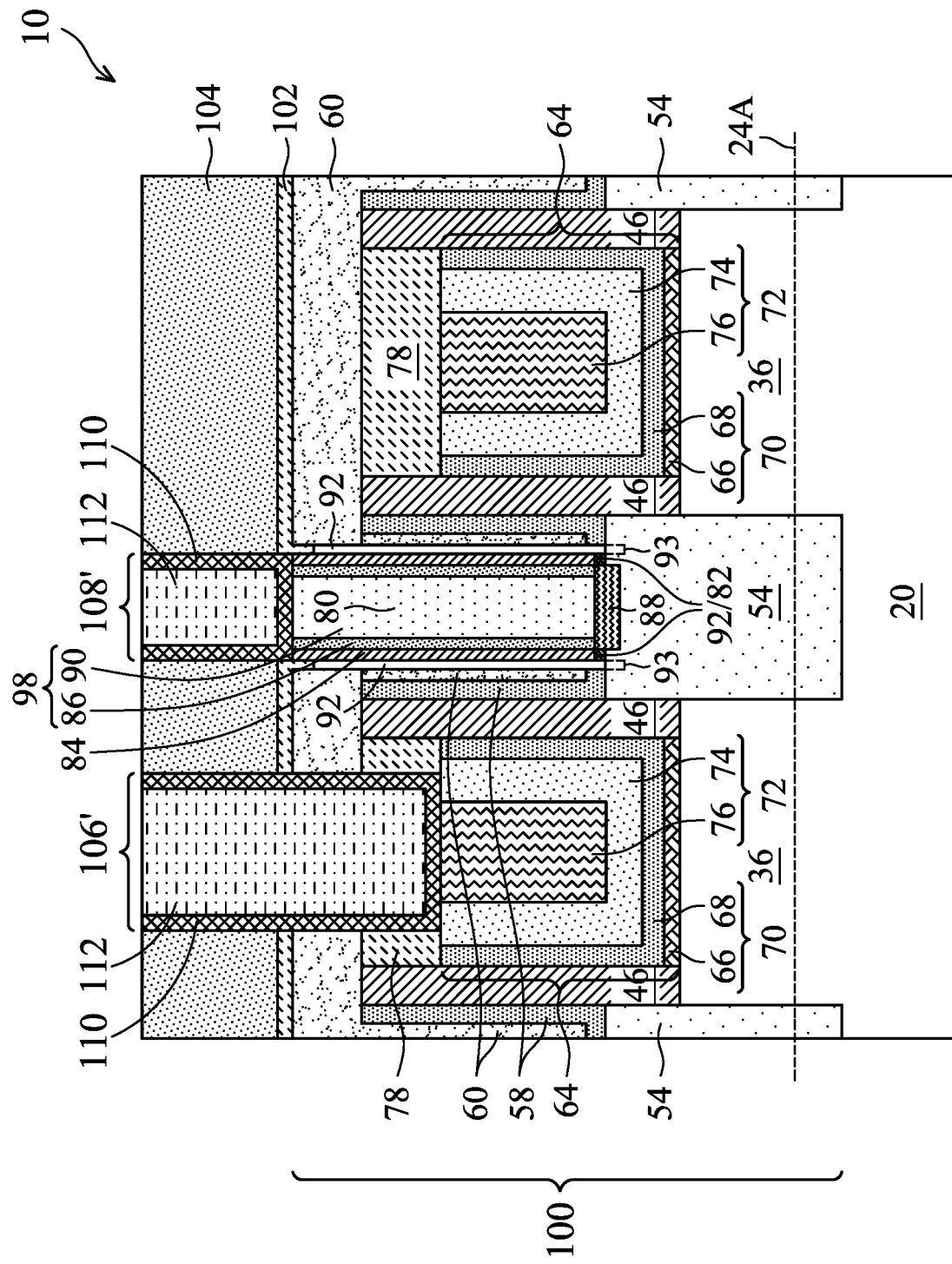

FIG. 24 illustrates a structure in accordance with some embodiments of the present disclosure, these embodiments are similar to the embodiments shown in FIG. 23, except that contact plugs 106' and 108', which are not encircled by air spacers, are formed.

The embodiments of the present disclosure have some advantageous features. By forming air spacers, the parasitic capacitance between the conductive features encircled by the air spacers and neighboring features is reduced. The increase in the flow rate ratio of hydrogen to nitrogen fluoride results in the reduction and the elimination of metal fluoride formation during the removal of the dummy silicon layer, and hence the pre-mature sealing of the air spacer is avoided.

In accordance with some embodiments of the present disclosure, a method includes forming an opening in a first dielectric layer, wherein an underlying region underlying the first dielectric layer is exposed to the opening; depositing a dummy silicon layer extending into the opening; depositing an isolation layer, wherein the isolation layer and the dummy silicon layer comprise a dummy silicon ring and an isolation ring, respectively, in the opening; filling the opening with a metallic region, wherein the metal region is encircled by the isolation ring; etching the dummy silicon layer to form an air spacer; and forming a second dielectric layer to seal the air spacer. In an embodiment, the etching the dummy silicon layer is performed using a process gas comprising hydrogen ($H_2$) and Nitrogen tri-fluoride ($NF_3$). In an embodiment, a ratio of a first flow rate of $H_2$ to a second flow rate of $NF_3$ is higher than about 41. In an embodiment, the etching the dummy silicon layer is performed using a fluorine-based etching gas, and in the etching the dummy silicon layer, no metal fluoride is left on an exposed surface of the metallic region. In an embodiment, the method further comprises forming a metal-containing capping layer extending into the opening; and performing an annealing process to react the metal-containing capping layer with the underlying region, wherein the underlying region comprises a silicon-containing semiconductor material. In an embodiment, the underlying region comprises a gate electrode. In an embodiment, the depositing the dummy silicon layer comprises depositing an amorphous silicon layer.

In accordance with some embodiments of the present disclosure, a method includes etching a dielectric layer to form an opening, with a semiconductor region being underlying and exposed to the opening; forming a silicon layer on sidewalls of the dielectric layer facing the opening, wherein the silicon layer further comprises a horizontal portion at a bottom of the opening; forming an isolation layer to cover the silicon layer; performing an anisotropic etching process on the silicon layer and the isolation layer to reveal the semiconductor region to the opening, wherein a silicon portion and an isolation portion, respectively, are left in the opening; depositing a metal-containing layer extending into the opening; performing a silicidation process to react the metal-containing layer with the semiconductor region, so that a silicide region is formed; filling the opening with a metal region; and etching the dummy silicon layer. In an embodiment, during the etching the dummy silicon layer, the isolation layer is not etched. In an embodiment, after the etching the dummy silicon layer, the silicide region is revealed, and the silicide region is not etched by a chemical used for etching the dummy silicon layer. In an embodiment, the etching the dummy silicon layer is performed using an etching gas comprising a fluorine-containing gas, and during the etching, no metal fluoride is formed on the metal region. In an embodiment, the etching gas comprises hydrogen ($H_2$) and nitrogen fluoride ($NF_3$), and a ratio of a first flow rate of the hydrogen to a second flow rate of the nitrogen fluoride is greater than 41. In an embodiment, after the etching the dummy silicon layer, an air spacer is formed between the isolation layer and the dielectric layer, and the method further comprises depositing an additional dielectric layer over the dielectric layer to seal the air spacer. In an embodiment, the silicon layer is formed as a substantially conformal layer.

In accordance with some embodiments of the present disclosure, a method includes depositing a silicon layer extending into an opening in a first dielectric layer; depositing a second dielectric layer on the silicon layer; removing horizontal portions of the silicon layer and the second dielectric layer; forming a silicide region at a bottom of the opening; filling the opening with a metal region; etching the silicon layer using an etching gas comprising hydrogen ($H_2$) and nitrogen fluoride ($NF_3$) to form an air spacer, until the silicide region is exposed to the air spacer; and depositing a third dielectric layer to seal the air spacer. In an embodiment, the forming the silicide region comprises, after the horizontal portions of the silicon layer and the second dielectric layer are removed, depositing a metal-containing layer extending into the opening; and performing an annealing process. In an embodiment, the method further comprises, before the etching the silicon layer, performing a planarization process to reveal the silicon layer, the first dielectric layer, and the second dielectric layer. In an embodiment, during the etching the silicon layer, no distinguishable metal fluoride is left on top of the metal region. In an embodiment, in the etching the silicon layer, a ratio of a first flow rate of the hydrogen to a second flow rate of the nitrogen fluoride is greater than 41. In an embodiment, the silicon layer comprises amorphous silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a gate stack;
    a source/drain region on a side of the gate stack;
    a silicide region over the source/drain region;
    a contact plug over the silicide region;
    a dielectric isolation layer encircling the contact plug; and
    an air spacer encircling the dielectric isolation layer.

2. The device of claim 1 further comprising a contact etch stop layer, wherein the source/drain region comprises a top surface contacting a bottom surface of the contact etch stop layer, and wherein the air spacer extends into the source/drain region, and extends to a level lower than the top surface of the source/drain region.

3. The device of claim 1 further comprising:
    a silicon layer underlying and contacting the dielectric isolation layer, wherein a sidewall of the silicon layer is exposed to the air spacer, and wherein the source/drain region is formed of a material different from the silicon layer.

4. The device of claim 3, wherein the silicon layer is an amorphous silicon layer.

5. The device of claim 3, wherein the silicon layer is a polysilicon layer.

6. The device of claim 1, wherein the air spacer further extends directly under the dielectric isolation layer.

7. The device of claim 1, wherein the air spacer comprises a portion forming a full ring fully encircling the dielectric isolation layer.

8. The device of claim 1 further comprising an etch stop layer, wherein the etch stop layer comprises:
    a first portion overlapping the contact plug; and
    a second portion overlapping the air spacer, wherein a bottom surface of the second portion is exposed to the air spacer.

9. A device comprising:
    a gate stack;
    a source/drain region on a side of the gate stack;
    a silicide region over the source/drain region;
    a contact plug over the silicide region;
    a dielectric isolation layer forming a ring encircling the contact plug; and
    an air spacer, wherein in a top view of the device, the air spacer comprises a first portion forming a full ring encircling the contact plug, and wherein a top surface of the source/drain region is exposed to the air spacer.

10. The device of claim 9, wherein the air spacer comprises a second portion overlapped by the dielectric isolation layer.

11. The device of claim 9 further comprising:
    a silicon layer vertically between the dielectric isolation layer and the source/drain region, wherein a sidewall of the silicon layer is exposed to the air spacer, and wherein the silicon layer and the source/drain region are formed of different materials.

12. The device of claim 11, wherein the air spacer extends lower than a bottom surface of the silicon layer.

13. The device of claim 9, wherein the dielectric isolation layer comprises silicon and nitrogen.

14. The device of claim 9 further comprising:
a contact etch stop layer comprising a bottom surface contacting the source/drain region; and
an inter-layer dielectric overlapping a bottom portion of the contact etch stop layer, wherein sidewalls of the contact etch stop layer and the inter-layer dielectric are exposed to the air spacer.

15. The device of claim 14, wherein the sidewalls of the contact etch stop layer and the inter-layer dielectric exposed to the air spacer are vertically aligned with each other.

16. A device comprising:
a bulk semiconductor substrate;
isolation regions over the bulk semiconductor substrate;
a semiconductor fin laterally between opposing portions of the isolation regions, wherein the semiconductor fin is higher than a top surface of the isolation regions;
a gate stack on the semiconductor fin;
a gate spacer on a first sidewall of the gate stack;
a dielectric region on a second sidewall of the gate spacer, wherein the dielectric region and the gate stack are on opposing sides of the gate spacer;
an air spacer, wherein the dielectric region is exposed to the air spacer;
a source/drain region comprising a sidewall, wherein an upper portion of the sidewall of the source/drain region contacts the gate spacer; and
a silicon layer overlying and contacting the source/drain region, wherein the silicon layer comprises an amorphous structure or a polysilicon structure.

17. The device of claim 16, wherein the silicon layer comprises a first edge facing and exposed to the air spacer.

18. The device of claim 17 further comprising a source/drain silicide region over and contacting the source/drain region, wherein the silicon layer further comprises a second edge, wherein the first edge and the second edge are opposite edges of the silicon layer, and wherein the second edge contacts the source/drain silicide region.

19. The device of claim 17, wherein the source/drain region comprises germanium, and wherein the silicon layer is substantially free from germanium.

20. The device of claim 16 further comprising a dielectric ring, wherein the dielectric region and the dielectric ring are on opposite sides of the air spacer, and wherein the dielectric ring is also exposed to the air spacer.

* * * * *